US012740157B2

(12) United States Patent
Katsuda et al.

(10) Patent No.: US 12,740,157 B2
(45) Date of Patent: Sep. 15, 2026

(54) SEMICONDUCTOR DEVICE

(71) Applicant: Nuvoton Technology Corporation Japan, Kyoto (JP)

(72) Inventors: Hiroto Katsuda, Kyoto (JP); Masaaki Hirako, Kyoto (JP); Takeshi Imamura, Kyoto (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 0 days.

(21) Appl. No.: 19/020,626

(22) Filed: Jan. 14, 2025

(65) Prior Publication Data

US 2025/0151413 A1 May 8, 2025

Related U.S. Application Data

(63) Continuation of application No. PCT/JP2024/014542, filed on Apr. 10, 2024.

(Continued)

(51) Int. Cl.
*H10D 89/60* (2025.01)
*H10D 64/60* (2025.01)

(Continued)

(52) U.S. Cl.
CPC ......... *H10D 89/911* (2025.01); *H10D 64/605* (2025.01); *H10D 84/141* (2025.01); *H10D 84/839* (2025.01); *H10D 89/931* (2025.01)

(58) Field of Classification Search
CPC .. H10D 89/911; H10D 64/605; H10D 84/141; H10D 89/931; H10D 62/127;

(Continued)

(56) References Cited

U.S. PATENT DOCUMENTS 8,431,998 B2 * 4/2013 Miyata ................. H10D 64/258 257/341
2008/0061326 A1 3/2008 Yoshida et al.

(Continued)

FOREIGN PATENT DOCUMENTS

JP 2008-053623 A 3/2008
JP 2012-119577 A 6/2012

(Continued)

OTHER PUBLICATIONS

Decision to Grant a Patent dated Nov. 19, 2024 issued in the corresponding Japanese Patent Application No. 2024-552326, with English translation.

(Continued)

*Primary Examiner* — Yara B Green
*Assistant Examiner* — Benjamin Michael Kupp
(74) *Attorney, Agent, or Firm* — Rimon P.C.

(57) ABSTRACT

A semiconductor device includes a semiconductor layer. The entire length of an outer peripheral side among outer peripheral sides of a first gate electrode region and the entire length of an outer peripheral side among outer peripheral sides of a first resistance element region match a portion of an outer peripheral side, among outer peripheral sides of the semiconductor layer, that is orthogonal to a border line and has the shortest distance to a first gate pad. Among four corner portions of an outer periphery of the first gate electrode region, only one corner portion is included in the outer peripheral sides of the first resistance element region, the only one corner portion having the shortest distance to the border line and the shortest distance to an outer peripheral side, among the outer peripheral sides of the semiconductor layer, that is orthogonal to the border line.

9 Claims, 19 Drawing Sheets

Related U.S. Application Data

(60) Provisional application No. 63/578,904, filed on Aug. 25, 2023.

(51) Int. Cl.
*H10D 84/00* (2025.01)
*H10D 84/83* (2025.01)

(58) Field of Classification Search
CPC ............... H10D 84/148; H10D 84/811; H10D 84/83125; H10D 30/668; H10D 84/8311; H10D 84/8312; H10D 84/83135; H10D 84/83138; H10D 84/8314; H10D 84/8316; H10D 84/832–833; H10D 84/835; H10D 84/836; H10D 84/837–839; H10D 84/83; H10D 84/834; H10D 84/84; H10D 84/853; H10D 84/856; H10D 30/64; H10D 84/101; H10D 84/01; H10D 62/10; H10D 62/128; H10D 62/129; H10D 84/813; H10D 84/817; H10W 72/926; H10W 72/921; H10W 72/922; H10W 72/9223; H10W 72/9226; H10W 72/923; H10W 72/9232; H10W 72/924; H10W 72/925; H10W 72/927; H10W 72/90
See application file for complete search history.

(56) References Cited

U.S. PATENT DOCUMENTS

| | | | | |
|---|---|---|---|---|
| 2009/0166740 | A1 | 7/2009 | Bhalla et al. | |
| 2020/0395479 | A1* | 12/2020 | Fujioka | H10D 30/63 |
| 2021/0202470 | A1 | 7/2021 | Hsieh | |

FOREIGN PATENT DOCUMENTS

| | | | |
|---|---|---|---|
| JP | 2013-065759 | A | 4/2013 |
| JP | 2013-161977 | A | 8/2013 |
| JP | 2023-083120 | A | 6/2023 |
| JP | 7323735 | B1 | 8/2023 |
| WO | 2020/129786 | A1 | 6/2020 |

OTHER PUBLICATIONS

International Search Report dated Jun. 25, 2024 issued in International Patent Application No. PCT/JP2024/014542.

* cited by examiner

SEMICONDUCTOR DEVICE

CROSS REFERENCE TO RELATED APPLICATIONS

This is a continuation application of PCT International Application No. PCT/JP2024/014542 filed on Apr. 10, 2024, designating the United States of America, which is based on and claims priority of U.S. Provisional Patent Application No. 63/578,904 filed on Aug. 25, 2023. The entire disclosures of the above-identified applications, including the specifications, drawings and claims are incorporated herein by reference in their entirety.

FIELD

The present disclosure relates to semiconductor devices and, in particular, to a chip-size-package type semiconductor device.

BACKGROUND

There has been a demand for reducing conduction resistance or downsizing in a vertical metal-oxide semiconductor (MOS) transistor in a dual configuration that is capable of controlling bidirectional conduction using one chip. With regard to the vertical MOS transistor in the dual configuration, a four-pad configuration including the required minimum number of pads is disclosed.

CITATION LIST

Patent Literature

PTL 1: Japanese Unexamined Patent Application Publication No. 2008-53623A

SUMMARY

Technical Problem

In order to improve electrostatic discharge (ESD) tolerance in a semiconductor device in which a vertical MOS transistor is provided, a resistance element may be disposed in the semiconductor device. However, the resistance element disposed reduces the area of a region that contributes to conduction of the vertical MOS transistor, which may make it difficult to reduce conduction resistance.

Solution to Problem

In order to solve the above problem, a semiconductor device according to one aspect of the present disclosure that is a facedown mountable, chip-size-package type semiconductor device, the semiconductor device comprising: a semiconductor layer that includes a semiconductor substrate; a first vertical metal-oxide semiconductor (MOS) transistor an entirety of which is provided in a first region of the semiconductor layer, on a top face side of the semiconductor layer; a second vertical MOS transistor an entirety of which is provided in a second region adjacent to the first region in a plan view of the semiconductor layer; and a metal layer that is connected to and in contact with the semiconductor substrate, on a bottom face side of the semiconductor layer, wherein the semiconductor substrate is a common drain region of the first vertical MOS transistor and the second vertical MOS transistor, in the plan view, the semiconductor layer is in a square shape, in the plan view, the first region and the second region are arranged in a first direction, in the plan view, a border line between the first region and the second region is a straight line that is orthogonal to the first direction, divides an area of the semiconductor layer in half, and passes through a center of the semiconductor layer, in the plan view, the first region includes only one first source pad and only one first gate pad, the one first source pad being connected to a first source electrode of the first vertical MOS transistor, the one first gate pad being connected to a first gate electrode of the first vertical MOS transistor, the first vertical MOS transistor includes: a first gate resistance element that is connected to the first gate electrode; a first gate electrode region that is a rectangular region encompassing the one first gate pad in the plan view, including neither the first source electrode nor the first gate resistance element, and having a largest area; and a first resistance element region that is a rectangular region encompassing the first gate resistance element in the plan view, including neither the first source electrode nor the first gate electrode region, and having a largest area, in the plan view, an entire length of an outer peripheral side among outer peripheral sides of the first gate electrode region and an entire length of an outer peripheral side among outer peripheral sides of the first resistance element region match a portion of an outer peripheral side among outer peripheral sides of the semiconductor layer, the outer peripheral side among the outer peripheral sides of the semiconductor layer being orthogonal to the border line and having a shortest distance to the one first gate pad, and in the plan view, the outer peripheral sides of the first resistance element region include only one corner portion among four corner portions of an outer periphery of the first gate electrode region, the one corner portion having a shortest distance to the border line and a shortest distance to one of outer peripheral sides among the outer peripheral sides of the semiconductor layer, the outer peripheral sides among the outer peripheral sides of the semiconductor layer being orthogonal to the border line.

Advantageous Effects

A semiconductor device according to one aspect of the present disclosure allows a small vertical MOS transistor in a dual configuration to reduce conduction resistance while improving ESD tolerance.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Each of the embodiments described below shows a specific example of the present disclosure. Numerical values, shapes, materials, constituent elements, the arrangement and connection of the constituent elements shown in the following embodiments are mere examples, and are not intended to limit the scope of the present disclosure.

In the present disclosure, the terminology "A and B are electrically connected" includes configurations in which A and B are directly connected via wiring, configurations in which A and B are directly connected without wiring, and configurations in which A and B are indirectly connected via a resistance component (resistance element, resistance wiring).

EMBODIMENT

[1. Structure of Semiconductor Device]

Hereinafter, the structure of a semiconductor device according to an embodiment is described.

The semiconductor device according to the embodiment is a facedown mountable, chip-size-package (CSP) type semiconductor device in which two vertical metal-oxide semiconductor (MOS) transistors are provided on a semiconductor substrate. The above two vertical MOS transistors are power transistors and what is called trench MOS field-effect transistors (FETs).

Figure 1:
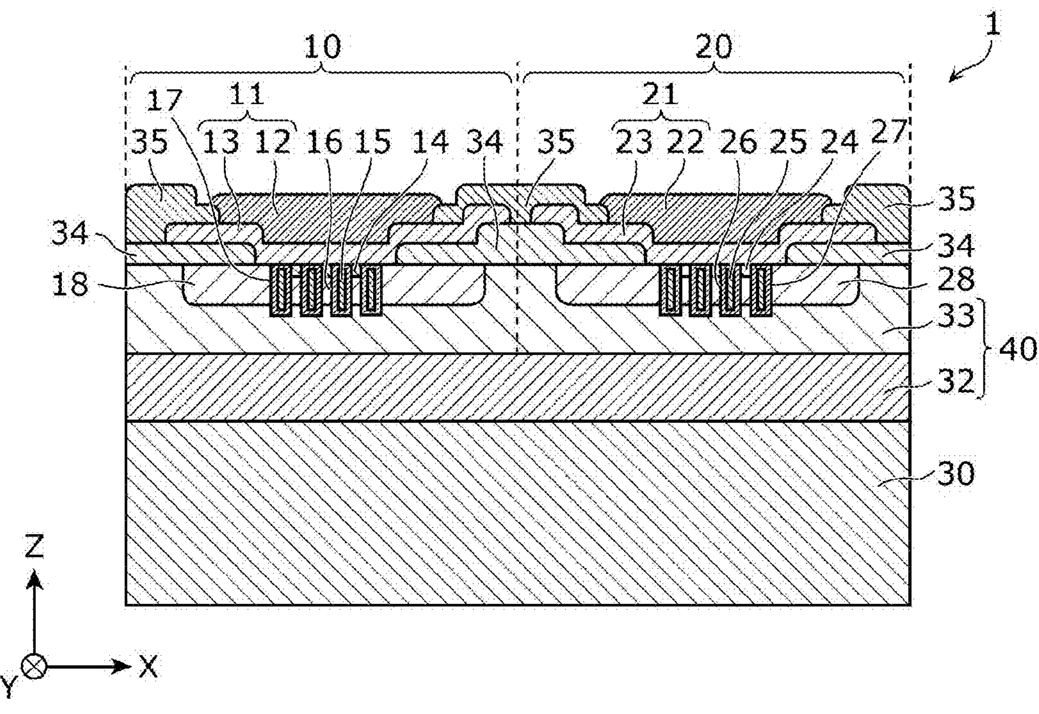
FIG. 1 is a schematic cross-sectional view illustrating an example of the structure of a semiconductor device according to an embodiment.
Figure 2:
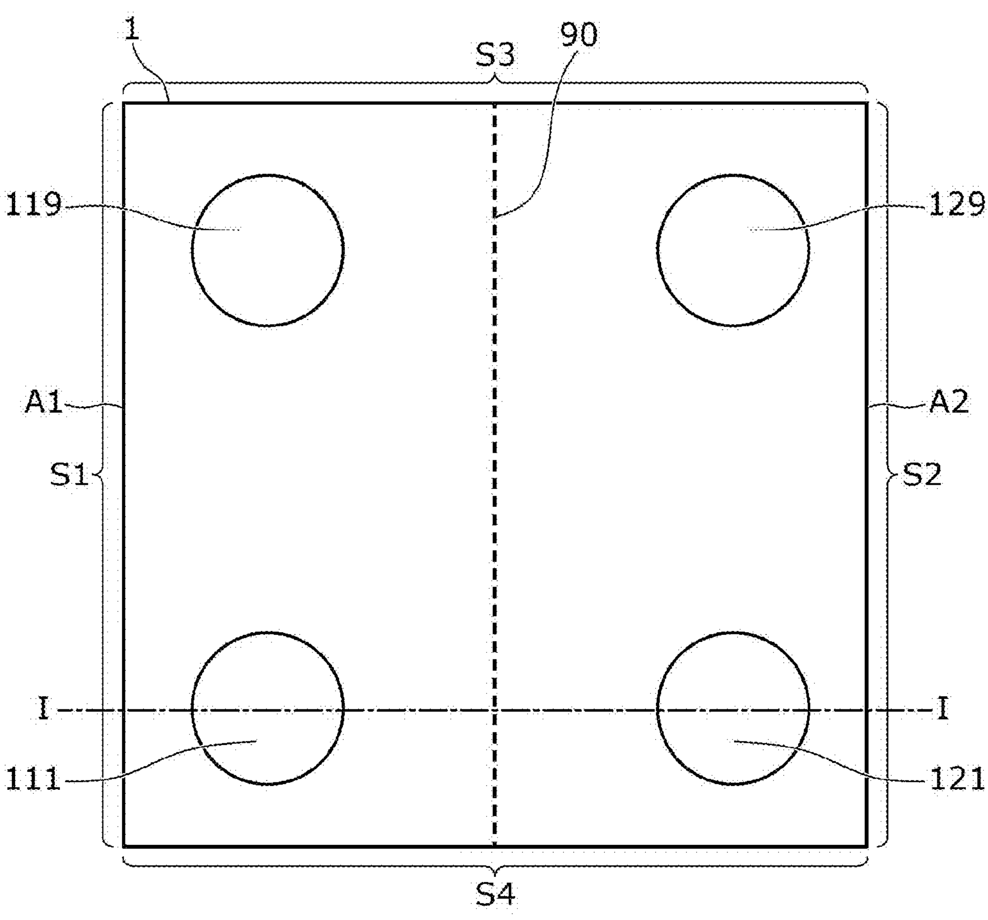
FIG. 2 is a schematic plan view illustrating an example of an arrangement of pads in the semiconductor device according to the embodiment.
Figure 2:
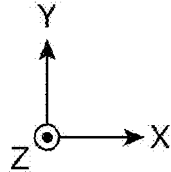

FIG. 1 is a schematic cross-sectional view illustrating an example of the structure of semiconductor device 1 according to the embodiment. FIG. 2 is a schematic plan view illustrating an example of an arrangement of pads in semiconductor device 1. FIG. 1 is a cross section taken along line I-I in FIG. 2.

As shown in FIG. 1 and FIG. 2, semiconductor device 1 includes: semiconductor layer 40; metal layer 30; first vertical MOS transistor 10 (hereinafter also referred to as "transistor 10") the entirety of which is provided in first region A1 of semiconductor layer 40; and second vertical MOS transistor 20 (hereinafter also referred to as "transistor 20") the entirety of which is provided in second region A2 of semiconductor layer 40.

Transistor 10 the entirety of which is provided in first region A1 means that, in a plan view, all the elements included in transistor 10 are contained within first region A1 and not contained within second region A2. Likewise, transistor 20 the entirety of which is provided in second region A2 means that, in the plan view, all the elements included in transistor 20 are contained within second region A2 and not contained within first region A1.

In the present disclosure, a combination of semiconductor substrate 32 and low-concentration impurity layer 33 is referred to as semiconductor layer 40. Semiconductor substrate 32 is disposed on a bottom face side (also referred to as a back face side) of semiconductor layer 40 and comprises silicon that contains impurities of a first conductivity type.

Low-concentration impurity layer 33 is an impurity layer of the first conductivity type that is disposed on a top face side (also referred to as a front face side) of semiconductor layer 40, provided in contact with semiconductor substrate 32, and contains impurities of the first conductivity type that have a concentration lower than that of the impurities of the first conductivity type of semiconductor substrate 32. Low-concentration impurity layer 33 may be provided on semiconductor substrate 32 by, for example, epitaxial growth.

Metal layer 30 is connected to and in contact with the back face side of semiconductor layer 40, that is, on a back face side of semiconductor substrate 32, and comprises silver (Ag) or copper (Cu). It should be noted that metal layer 30 may include a trace amount of a chemical element other than metal mixed in as impurities in a manufacturing process for a metal material. Moreover, metal layer 30 need not be provided on an entire surface on the back face side of semiconductor layer 40.

As shown in FIG. 1, first body region 18 of a second conductivity type that contains impurities of the second conductivity type different from the first conductivity type is provided in first region A1 of low-concentration impurity layer 33. First source region 14 of the first conductivity type that contains impurities of the first conductivity type is provided in first body region 18.

Moreover, a plurality of first gate trenches 17 that penetrate through first source region 14 and first body region 18 from a top face of semiconductor layer 40 to a depth that reaches a portion of low-concentration impurity layer 33 are provided in first region A1, and further first gate conductor 15 is provided on first gate insulating film 16 inside each of the plurality of first gate trenches 17. First gate conductor 15 is an embedded gate electrode that is embedded inside semiconductor layer 40, and is electrically connected to first gate pad 119.

First source electrode 11 includes portion 12 and portion 13. Portion 12 is connected to first source region 14 and first body region 18 via portion 13.

Portion 12 of first source electrode 11 is a layer joined with solder at the time of reflow in facedown mounting, and may comprise, as a non-limiting example, a metal material including at least one of nickel, titanium, tungsten, or palladium. The surface of portion 12 may be plated with gold etc.

Portion 13 of first source electrode 11 is a layer that connects portion 12 and semiconductor layer 40, and may comprise, as a non-limiting example, a metal material including at least one of aluminum, copper, gold, or silver.

Second body region 28 of the second conductivity type that contains impurities of the second conductivity type is provided in second region A2 of low-concentration impurity layer 33. Second source region 24 of the first conductivity type that contains impurities of the first conductivity type is provided in second body region 28.

Moreover, a plurality of second gate trenches 27 that penetrate through second source region 24 and second body region 28 from the top face of semiconductor layer 40 to a depth that reaches a portion of low-concentration impurity layer 33 are provided in second region A2, and further second gate conductor 25 is provided on second gate insulating film 26 inside each of the plurality of second gate trenches 27. Second gate conductor 25 is an embedded gate electrode that is embedded inside semiconductor layer 40, and is electrically connected to second gate pad 129.

Second source electrode 21 includes portion 22 and portion 23. Portion 22 is connected to second source region 24 and second body region 28 via portion 23.

Portion 22 of second source electrode 21 is a layer joined with solder at the time of reflow in facedown mounting, and may comprise, as a non-limiting example, a metal material including at least one of nickel, titanium, tungsten, or palladium. The surface of portion 22 may be plated with gold etc.

Portion 23 of second source electrode 21 is a layer that connects portion 22 and semiconductor layer 40, and may comprise, as a non-limiting example, a metal material including at least one of aluminum, copper, gold, or silver.

The above-described configuration of transistor 10 and transistor 20 allows semiconductor substrate 32 and an area of low-concentration impurity layer 33 in the proximity of an area immediately above semiconductor substrate 32 to be a common drain region having a first drain region of transistor 10 and a second drain region of transistor 20 in common. Additionally, metal layer 30 is a common drain electrode having a first drain electrode of transistor 10 and a second drain electrode of transistor 20 in common.

As shown in FIG. 1, first body region 18 is covered with interlayer insulating layer 34 having openings, and portion 13 of first source electrode 11 is connected to first source region 14 via the openings of interlayer insulating layer 34. Interlayer insulating layer 34 and portion 13 of first source electrode 11 are covered with passivation layer 35 having openings, and portion 12 is connected to portion 13 of first source electrode 11 via the openings of passivation layer 35.

Second body region 28 is covered with interlayer insulating layer 34 having openings, and portion 23 of second source electrode 21 is connected to second source region 24 via the openings of interlayer insulating layer 34. Interlayer insulating layer 34 and portion 23 of second source electrode 21 are covered with passivation layer 35 having openings, and portion 22 is connected to portion 23 of second source electrode 21 via the openings of passivation layer 35.

Accordingly, first source pad 111 and second source pad 121 refer to a region in which first source electrode 11 is partially exposed to the surface of semiconductor device 1 and a region in which second source electrode 21 partially exposed to the surface of semiconductor device 1, respectively, that is, terminal portions. Similarly, first gate pad 119 and second gate pad 129 refer to a region in which first gate electrode 19 (not shown in FIG. 1 and FIG. 2) is partially exposed to the surface of semiconductor device 1 and a region in which second gate electrode 29 (not shown in FIG. 1 and FIG. 2) is partially exposed to the surface of semiconductor device 1, respectively, that is, terminal portions.

A material included in first gate electrode 19 and second gate electrode 29 may be the same as a material included in first source electrode 11 and second source electrode 21.

As an example of the thickness of each structure in semiconductor device 1, the thickness of semiconductor layer 40 is 10 μm to 90 μm, the thickness of metal layer 30 is 10 μm to 90 μm, and the sum of the thicknesses of interlayer insulating layer 34 and passivation layer 35 is 3 μm to 13 μm.

As shown in FIG. 1 and FIG. 2, transistor 10 includes, on the surface of semiconductor layer 40, first source pad 111 and first gate pad 119 that are joined to a mounting substrate via a joint material at the time of facedown mounting. In addition, transistor 20 includes, on the surface of semiconductor layer 40, second source pad 121 and second gate pad 129 that are joined to a mounting substrate at the time of facedown mounting.

As shown in FIG. 2, semiconductor layer 40 is in a square shape in the plan view.

In FIG. 2, virtual border line 90 that separates first region A1 and second region A2 of semiconductor layer 40 is indicated by the dashed line. Border line 90 between first region A1 and second region A2 may be viewed as a virtual line tracing the central position of a space between portion 13 of first source electrode 11 and portion 23 of second source electrode 21. Moreover, border line 90 may be viewed as the space itself having a limited width. Even when border line 90 is the space, the space can be recognized as a line by appearance to the naked eye or with low magnification.

In the plan view, border line 90 is a straight virtual line that is orthogonal to a first direction, divides semiconductor layer 40 into equal areas in the first direction, and passes through the center of semiconductor layer 40. The center of semiconductor layer 40 is an intersection point of two diagonal lines of semiconductor layer 40 in the plan view.

The first direction is, among directions parallel to the outer peripheral sides of semiconductor device 1, a direction in which first region A1 and second region A2 are arranged, in the plan view.

As shown in FIG. 2, in the plan view, first region A1 and second region A2 are adjacent to each other, divide semiconductor layer 40 into equal areas, and each are a region in a rectangular shape. In the plan view, semiconductor layer 40 includes no region other than first region A1 and second region A2.

Outer peripheral sides refer to sides constituting the outline of a shape. In the case of a square shape such as semiconductor layer 40 or a rectangular shape such as first region A1, outer peripheral sides refer to the four sides constituting each of the shapes. Furthermore, in the case of a shape other than the rectangular shape, outer peripheral sides refer to a plurality of sides forming the outer periphery of the shape.

As shown in FIG. 2, in the present disclosure, in the plan view, among two outer peripheral sides that are included in the outer peripheral sides of semiconductor layer 40 and parallel to border line 90, an outer peripheral side having the shortest distance to first gate pad 119 is defined as first side S1, and an other outer peripheral side having the shortest distance to second gate pad 129 and being opposite to first side S1 is defined as second side S2.

Likewise, in the plan view, among two outer peripheral sides that are included in the outer peripheral sides of semiconductor layer 40 and orthogonal to border line 90, an outer peripheral side having the shortest distance to first gate pad 119 is defined as third side S3, and an other outer peripheral side having the shortest distance to first source pad 111 and being opposite to third side S3 is defined as fourth side S4.

It should be noted that since semiconductor layer 40 is in the square shape in the plan view, first side S1, second side S2, third side S3, and fourth side S4 are identical in length.

The number of first source pads 111 in transistor 10 and the number of second source pads 121 in transistor 20 each are one as shown in FIG. 2. In addition, the number of first gate pads 119 in transistor 10 and the number of second gate pads 129 in transistor 20 each are one as shown in FIG. 2.

In other words, semiconductor device 1 in the present disclosure is a vertical MOS transistor in a dual configuration that includes a common drain electrode and in which two vertical MOS transistors are included in one semiconductor device, and is a semiconductor device in a four-pad configuration that includes corresponding pads for respective source electrodes and gate electrodes of vertical MOS transistors on a one-to-one basis.

Although the size, shape, and arrangement of the pads in the plan view shown in FIG. 2 are one example, the shape and size of the four pads (first source pad 111, first gate pad 119, second source pad 121, second gate pat 129) may be uniform, and further circular shapes having the same diameter are desirable.

Figure 3:
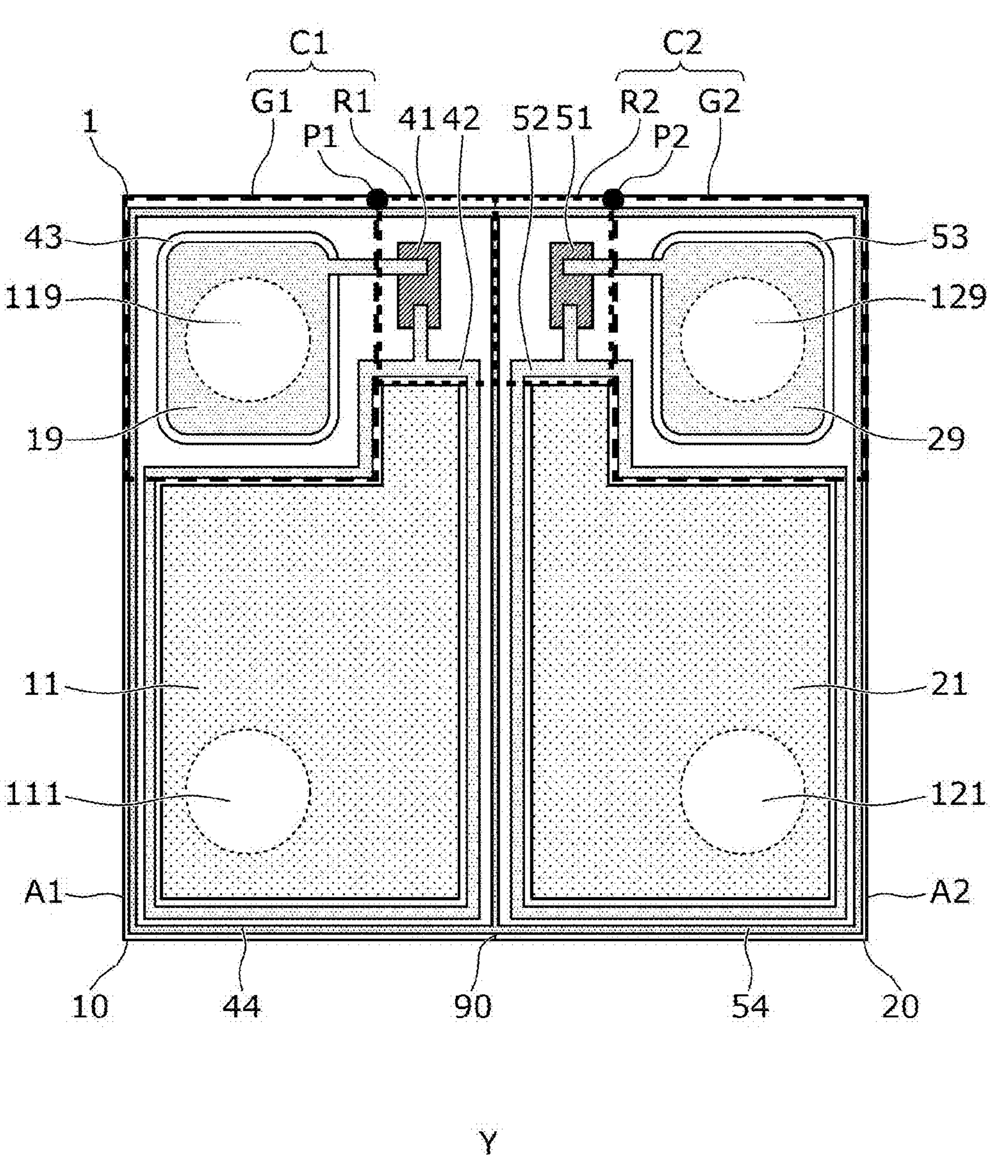
FIG. 3 is a schematic plan view illustrating an example of shapes and an arrangement of constituent elements in the semiconductor device according to the embodiment.
Figure 3:
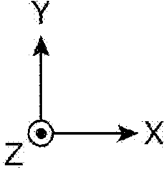

FIG. 3 is a schematic plan view illustrating an example of shapes and an arrangement of constituent elements in semiconductor device 1 in the plan view. In FIG. 3, passivation layer 35 and interlayer insulating layer 34 are omitted as if these layers are transparent in order to clearly show the structure of the top face of semiconductor layer 40 that cannot be visually recognized in reality. Each pad indicated by the dashed line is shown for the sake of understanding a correspondence relation with FIG. 2.

As shown in FIG. 3, in the plan view, shapes and an arrangement of constituent elements included in first region A1 and shapes and an arrangement of constituent elements included in second region A2 and corresponding to the constituent elements included in first region A1 are arranged, on a one-to-one basis, line-symmetrically with respect to border line 90 as a symmetric axis. Examples of the corresponding constituent elements on the one-to-one basis include first gate electrode 19 and second gate electrode 29, first source pad 111 and second source pad 121, and first gate resistance element 41 and second gate resistance element 51 described later. The same applies to first control region C1 and second control region C2 described later. In the plan view, those constituent elements are arranged line-symmetrically with respect to border line 90 as the symmetric axis.

As shown in FIG. 3, first gate resistance element 41 connected to first gate electrode 19 is provided in first region A1 of semiconductor device 1, and second gate resistance element 51 connected to second gate electrode 29 is provided in second region A2 of semiconductor device 1.

First gate resistance element 41 and second gate resistance element 51 each comprise, as a non-limiting example, polysilicon into which impurities of the first conductivity type or the second conductivity type are injected. Each of the gate resistance elements comprises a material having a resistance value higher than a resistance value of a metal material comprised in a source electrode etc.

First gate resistance element 41 and second gate resistance element 51 are each disposed to prevent a corresponding one of transistor 10 and transistor 20 from being damaged when an excessive voltage is applied to or a surge current flows through a gate electrode. In other words, first gate resistance element 41 and second gate resistance element 51 are elements disposed to improve the ESD tolerance of semiconductor device 1.

Moreover, as shown in FIG. 3, first region A1 of semiconductor device 1 includes first gate wiring 42 that is connected to first gate electrode 19 via first gate resistance element 41 and disposed to surround first source electrode 11. Similarly, second region A2 of semiconductor device 1 includes second gate wiring 52 that is connected to second gate electrode 29 via second gate resistance element 51 and disposed to surround second source electrode 21.

First gate wiring 42 and second gate wiring 52 each comprise, as a non-limiting example, polysilicon into which impurities of the first conductivity type or the second conductivity type are injected, or the same metal type as first gate electrode 19 and second gate electrode 29. First gate wiring 42 and second gate wiring 52 are connected to first gate conductor 15 and second gate conductor 25, respectively.

Furthermore, as shown in FIG. 3, in the plan view, first region A1 includes first Zener diode 43 that is connected to first source electrode 11 and first gate electrode 19 and disposed on the periphery of first gate electrode 19. Likewise, second region A2 includes second Zener diode 53 that is connected to second source electrode 21 and second gate electrode 29 and disposed on the periphery of second gate electrode 29.

First Zener diode 43 and second Zener diode 53 may each be a bidirectional Zener diode that comprises, as a non-limiting example, polysilicon into which impurities of the first conductivity type or the second conductivity type are injected, and has one or more PN junctions.

First Zener diode 43 and second Zener diode 53 are each disposed to prevent a corresponding one of transistor 10 and transistor 20 from being damaged when an excessive voltage is applied to or a surge current flows through the gate electrode or the source electrode. To put it another way, first Zener diode 43 and second Zener diode 53 are elements disposed to improve the ESD tolerance of semiconductor device 1.

Figure 14:
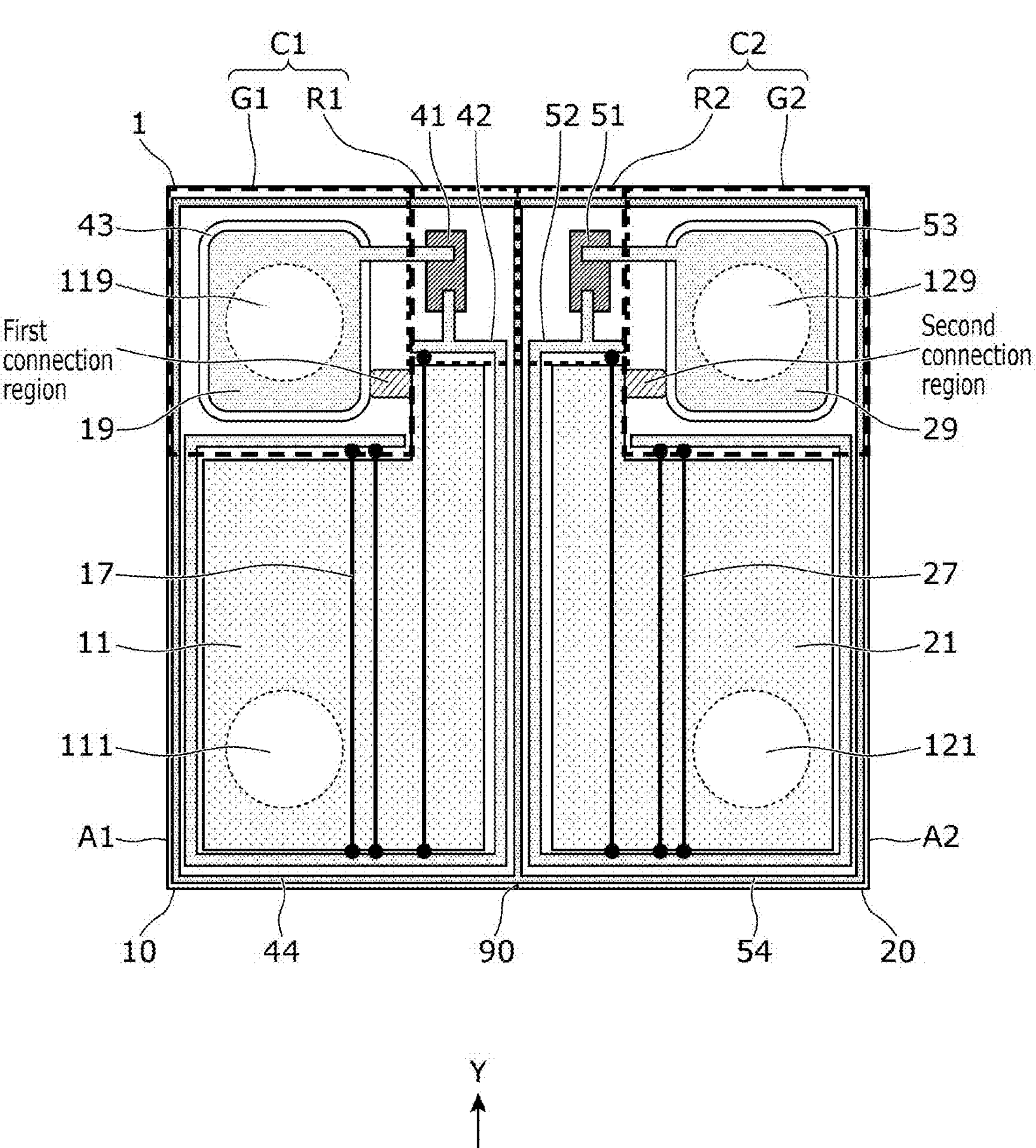
FIG. 14 is a schematic plan view illustrating an example of shapes and an arrangement of constituent elements in the semiconductor device according to the embodiment.

Moreover, though not shown in FIG. 3, first region A1 includes a first connection region in which first Zener diode 43 and first source electrode 11 are connected, and second region A2 includes a second connection region in which second Zener diode 53 and second source electrode 21 are connected (see FIG. 14).

It should be noted that the first connection region and the second connection region each comprise the same metal type as portion 13 of first source electrode 11 and portion 23 of second source electrode 21, and in the plan view, first gate trench 17 and second gate trench 27 are not disposed immediately below the first connection region and the second connection region, respectively.

Furthermore, as shown in FIG. 3, in the plan view, first equipotential ring (EQR) 44 electrically connected to semiconductor substrate 32 that is the common drain region may be disposed on the outer periphery of first region A1. Similarly, in the plan view, second EQR 54 electrically connected to semiconductor substrate 32 that is the common drain region may be disposed on the outer periphery of second region A2. First EQR 44 and second EQR 54 may be shared at a portion in which transistor 10 and transistor 20 are adjacent to and face each other in the plan view.

It should be noted that a portion at which first EQR 44 and second EQR 54 are shared and that is orthogonal to the first direction may be viewed as border line 90.

First EQR 44 is disposed in transistor 10 in expectation of preventing a leak current from flowing between an outside and first body region 18. Additionally, second EQR 54 is disposed in transistor 20 in expectation of preventing a leak current from flowing between the outside and second body region 28.

First EQR 44 and second EQR 54 may each comprise, as a non-limiting example, a metal material including at least one of aluminum, copper, gold, or silver. In addition, first EQR 44 and second EQR 54 may be electrically connected to metal layer 30 via semiconductor substrate 32 that is the common drain region.

As shown in FIG. 3, in first region A1, a rectangular region that encompasses first gate pad 119, includes neither first source electrode 11 nor first gate resistance element 41, and has the largest area in the plan view is referred to as first gate electrode region G1.

Likewise, as shown in FIG. 3, in second region A2, a rectangular region that encompasses second gate pad 129, includes neither second source electrode 21 nor second gate resistance element 51, and has the largest area in the plan view is referred to as second gate electrode region G2.

Moreover, as shown in FIG. 3, in first region A1, a rectangular region that encompasses first gate resistance element 41, includes neither first source electrode 11 nor first gate electrode region G1, and has the largest area in the plan view is referred to as first resistance element region R1.

Similarly, as shown in FIG. 3, in second region A2, a rectangular region that encompasses second gate resistance element 51, includes neither second source electrode 21 nor second gate electrode region G2, and has the largest area in the plan view is referred to as second resistance element region R2.

In the plan view, first gate electrode region G1 and first resistance element region R1 never overlap due to the definitions each defining the range of a corresponding one of the regions. However, in the plan view, portions of the outer peripheral sides of the respective regions may match each other.

Likewise, in the plan view, second gate electrode region G2 and second resistance element region R2 never overlap due to the definitions each defining the range of a corresponding one of the regions. However, in the plan view, portions of the outer peripheral sides of the respective regions may match each other.

It should be noted that in the present disclosure, when an outer peripheral side of a region and an outer peripheral side of another region are expressed as matching in the plan view, such an expression may be interpreted as the outer peripheral sides of the respective regions overlapping or being shared in common.

As shown in FIG. 3, in the plan view, at least one of the outer peripheral sides of first gate electrode region G1 and at least one of the outer peripheral sides of first resistance element region R1 both match a portion of third side S3 of semiconductor layer 40.

Similarly, as shown in FIG. 3, in the plan view, at least one of the outer peripheral sides of second gate electrode region G2 and at least one of the outer peripheral sides of second resistance element region R2 both match a portion of third side S3 of semiconductor layer 40.

Furthermore, as shown in FIG. 3, in the plan view, the outer peripheral sides of first resistance element region R1 include, among the four corner portions of the outer periphery of first gate electrode region G1, only one corner portion (also referred to as first corner portion P1) having the shortest distance to border line 90 and the shortest distance to third side S3 of semiconductor layer 40, and do not include the remaining corner portions.

Likewise, as shown in FIG. 3, in the plan view, the outer peripheral sides of second resistance element region R2 include, among the four corner portions of the outer periphery of second gate electrode region G2, only one corner portion (also referred to as second corner portion P2) having the shortest distance to border line 90 and the shortest distance to third side S3 of semiconductor layer 40, and do not include the remaining corner portions.

As shown in FIG. 3, in first region A1, a region obtained by combining first gate electrode region G1 and first resistance element region R1 in the plan view is referred to as first control region C1. Similarly, in second region A2, a region obtained by combining second gate electrode region G2 and second resistance element region R2 in the plan view is referred to as second control region C2.

As shown in FIG. 3, in semiconductor device 1, in the plan view, at least one of outer peripheral sides of first control region C1 and at least one of outer peripheral sides of second control region C2 each match a portion of third side S3 of semiconductor layer 40, and the outer peripheral sides of first control region C1 and the outer peripheral sides of second control region C2 include no portion matching fourth side S4 of semiconductor layer 40.

Moreover, as shown in FIG. 3, in the plan view, among one or more lengths of one or more portions in each of which an outer peripheral side of first control region C1 and an outer peripheral side of semiconductor layer 40 match, a length of a portion in which an outer peripheral side of first control region C1 and third side S3 of semiconductor layer 40 match is greatest.

Likewise, as shown in FIG. 3, in the plan view, among one or more lengths of one or more portions in each of which an outer peripheral side of second control region C2 and an outer peripheral side of semiconductor layer 40 match, a length of a portion in which an outer peripheral side of second control region C2 and third side S3 of semiconductor layer 40 match is greatest.

FIG. 3 shows an example in which an outer peripheral side of first control region C1 and an outer peripheral side of second control region C2 match a portion of first side S1 and a portion of second side S2 of semiconductor layer 40, respectively, in the plan view. However, semiconductor device 1 according to the present embodiment need not include portions in which an outer peripheral side of first control region C1 and an outer peripheral side of second control region C2 match a portion of first side S1 and a portion of second side S2 of semiconductor layer 40, respectively, in the plan view.

Furthermore, FIG. 3 shows an example in which an outer peripheral side of first control region C1 and an outer peripheral side of second control region C2 each match a portion of border line 90. However, semiconductor device 1 according to the present embodiment need not include portions in which an outer peripheral side of first control region C1 and an outer peripheral side of second control region C2 each match a portion of border line 90.

Figure 4:
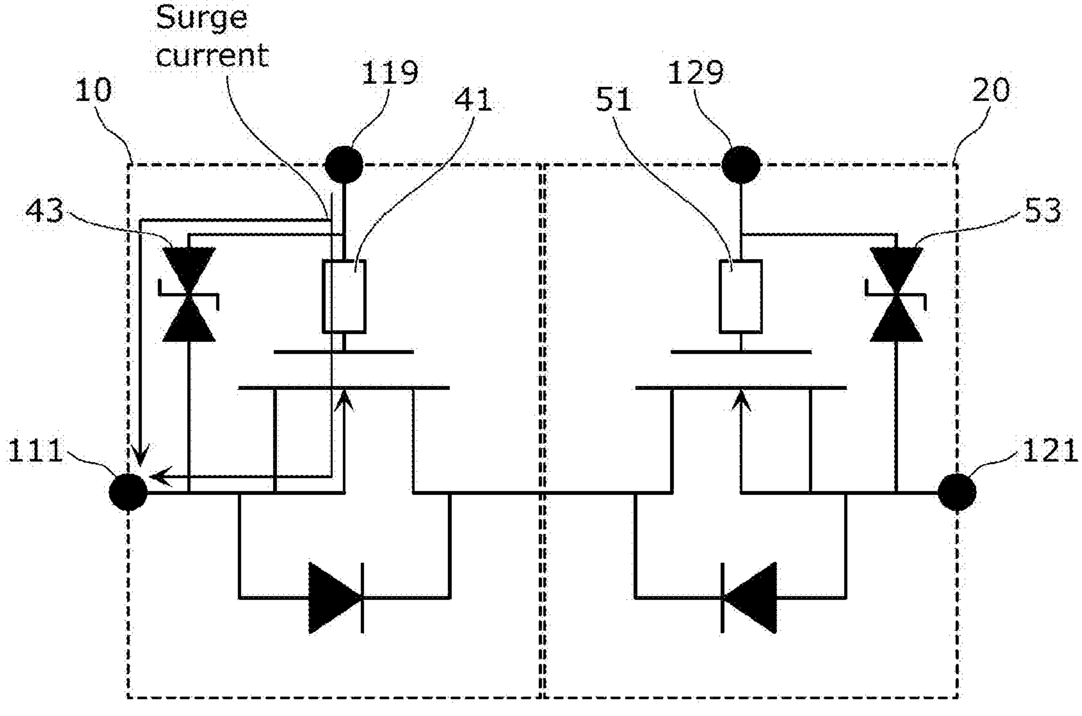
FIG. 4 is a circuit diagram illustrating an equivalent circuit in the semiconductor device according to the embodiment.

FIG. 4 is a circuit diagram illustrating an equivalent circuit in semiconductor device 1 according to the present embodiment.

As shown in FIG. 4, in transistor 10, first gate resistance element 41 and first Zener diode 43 are connected in parallel between first gate pad 119 and first source pad 111.

A path in which a current flows between first gate pad 119 and first source pad 111 via first Zener diode 43 becomes conductive when an excessive voltage is applied to or a surge current flows through first gate pad 119 or first source pad 111 due to the function of first Zener diode 43.

In general, there is a damage to a gate insulating film as a damage mode of a vertical MOS transistor caused by the application of an excessive voltage or the flow of a surge current. By including first Zener diode 43, transistor 10 makes it possible to divert a surge current and reduce a load on first gate insulating film 16. Since this makes it possible to prevent first gate insulating film 16 from being damaged, it is possible to improve the ESD tolerance of transistor 10.

In addition, since it is possible to further dramatically decrease the surge current flowing through first gate insulating film 16 by transistor 10 including first gate resistance element 41 in parallel with first Zener diode 43, it is possible to further improve the ESD tolerance of transistor 10.

In the above description, the case in which the excessive voltage is applied to or the surge current flows through first gate pad 119 or first source pad 111 of transistor 10 is used as an example. The same description applies to a case in which an excessive voltage is applied to or a surge current flows through second gate pad 129 or second source pad 121 of transistor 20. Since it is possible to prevent second gate insulating film 26 from being damaged, by transistor 20 including second Zener diode 53 and second gate resistance element 51, it is possible to improve the ESD tolerance of transistor 20.

[2. Operation of Semiconductor Device]

Figure 5A:
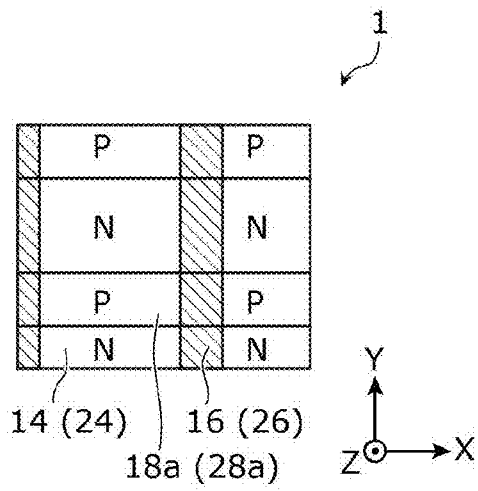
FIG. 5A is a schematic plan view of an approximate single unit configuration of a first transistor according to the embodiment.
Figure 5B:
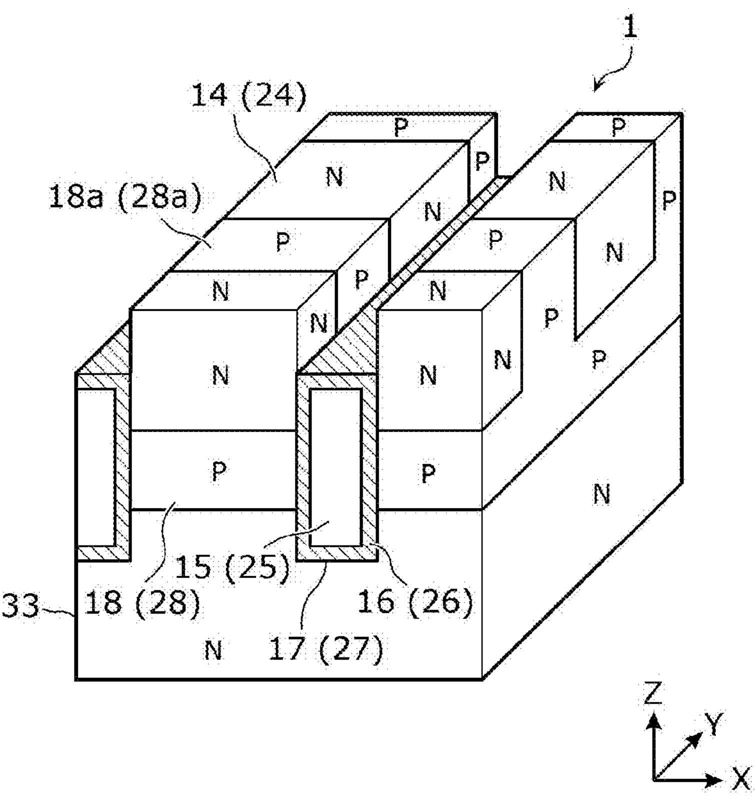
FIG. 5B is a schematic perspective view of the approximate single unit configuration of the first transistor according to the embodiment.

FIG. 5A and FIG. 5B are a plan view and a perspective view of an approximate single unit configuration of transistor 10 or transistor 20 that is repeatedly formed in an X direction and a Y direction of semiconductor device 1, respectively. For the sake of clarity, neither FIG. 5A nor FIG. 5B illustrates semiconductor substrate 32, metal layer 30, passivation layer 35, first source electrode 11 or second source electrode 21, and interlayer insulating layer 34.

It should be noted that the Y direction is a direction that is parallel to the top face of semiconductor layer 40 and in which first gate trench 17 extends. Additionally, the X direction is a direction that is parallel to the top face of semiconductor layer 40 and orthogonal to the Y direction. A Z direction is a direction that is orthogonal to both the X direction and the Y direction and indicates a height direction of semiconductor device 1.

As shown in FIG. 5A and FIG. 5B, transistor 10 includes first connector 18*a* that electrically connects first body region 18 and first source electrode 11. First connector 18*a* is a region of first body region 18 in which first source region 14 is not provided, and contains the same impurities of the second conductivity type as those of first body region 18. First source region 14 and first connector 18*a* are alternately and periodically disposed in the Y direction. The same applies to transistor 20.

In semiconductor device 1, for example, assuming that the first conductivity type is N-type and the second conductivity type is P-type, first source region 14, second source region 24, semiconductor substrate 32, and low-concentration impurity layer 33 may be N-type semiconductors, and first body region 18, first connector 18*a*, second body region 28, and second connector 28*a* may be P-type semiconductors.

Moreover, in semiconductor device 1, for example, assuming that the first conductivity type is P-type and the second conductivity type is N-type, first source region 14, second source region 24, semiconductor substrate 32, and low-concentration impurity layer 33 may be P-type semiconductors, and first body region 18, first connector 18*a*, second body region 28, and second connector 28*a* may be N-type semiconductors.

The following describes a bidirectional conductive pathway of semiconductor device 1, assuming transistor 10 and transistor 20 are what is called N-channel type transistors with the first conductivity type being the N type and the second conductivity type being the P type.

In semiconductor device 1, when a high voltage and a low voltage are applied to first source electrode 11 and second source electrode 21, respectively, and a voltage higher than or equal to a threshold value is applied to second gate electrode 29 (second gate conductor 25) with respect to second source electrode 21, a conducting channel is formed in the vicinity of second gate insulating film 26 in second body region 28. As a result, a main current flows in a pathway from first source electrode 11 to first connector 18*a* to first body region 18 to low-concentration impurity layer 33 to semiconductor substrate 32 to metal layer 30 to semiconductor substrate 32 to low-concentration impurity layer 33 to the conducting channel formed in second body region 28 to second source region 24 to second source electrode 21, and semiconductor device 1 becomes conductive. A PN junction is in an interface between first body region 18 and low-concentration impurity layer 33 in this conductive pathway and serves as a body diode.

Likewise, in semiconductor device 1, when a high voltage and a low voltage are applied to second source electrode 21 and first source electrode 11, respectively, and a voltage higher than or equal to a threshold value is applied to first gate electrode 19 (first gate conductor 15) with respect to first source electrode 11, a conducting channel is formed in the vicinity of first gate insulating film 16 in first body region 18. As a result, a main current flows in a pathway from second source electrode 21 to second connector 28*a* to second body region 28 to low-concentration impurity layer 33 to semiconductor substrate 32 to metal layer 30 to semiconductor substrate 32 to low-concentration impurity layer 33 to the conducting channel formed in first body region 18 to first source region 14 to first source electrode 11, and semiconductor device 1 becomes conductive. A PN junction is in an interface between second body region 28 and low-concentration impurity layer 33 in this conductive pathway and serves as a body diode.

Furthermore, in semiconductor device 1, a conducting channel may be formed in the vicinity of first gate insulating film 16 in first body region 18 by applying a voltage higher than or equal to a threshold value to first gate electrode 19, and at the same time a conducting channel may be formed in the vicinity of second gate insulating film 26 in second body region 28 by applying a voltage higher than or equal to a threshold value to second gate electrode 29. As a result, a current flows in a pathway from first source electrode 11 to first source region 14 to the conducting channel formed in first body region 18 to low-concentration impurity layer 33 to semiconductor substrate 32 to metal layer 30 to semiconductor substrate 32 to low-concentration impurity layer 33 to the conducting channel formed in second body region 28 to second source region 24 to second source electrode 21, or a current flows in a reverse pathway of the pathway, and semiconductor device 1 may be conducted.

Figure 6:
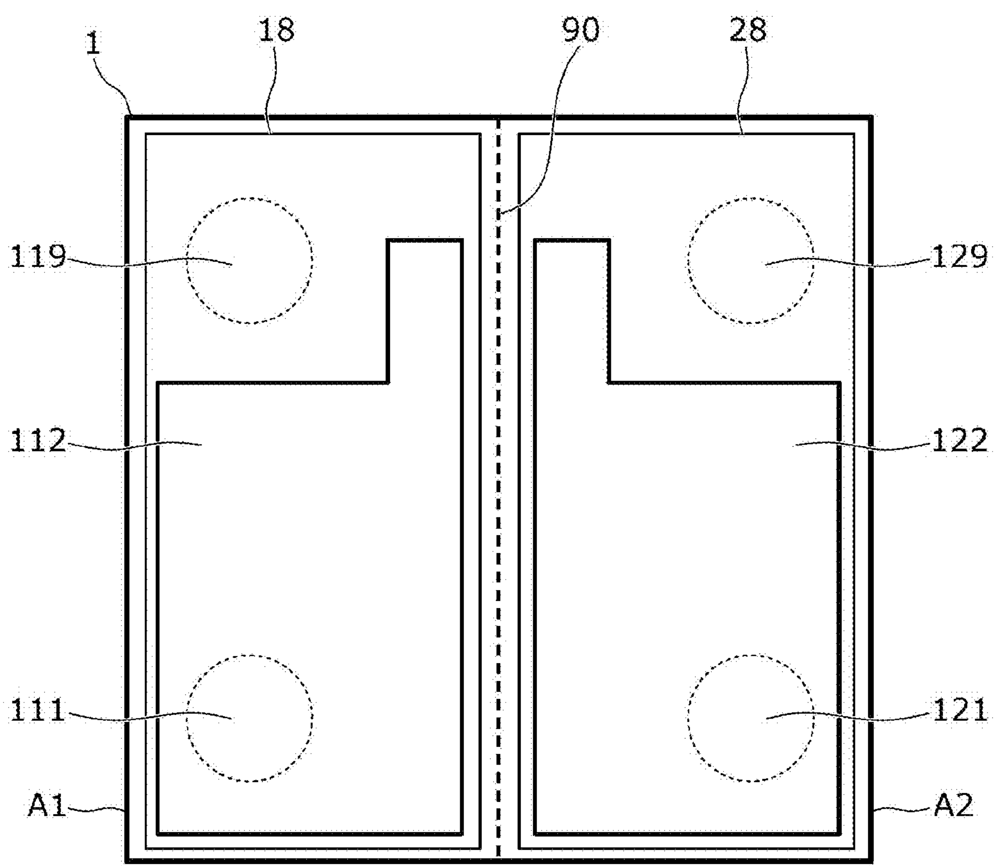
FIG. 6 is a plan view illustrating an example of shapes and an arrangement of constituent elements in the semiconductor device according to the embodiment.
Figure 6:
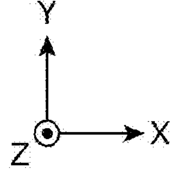

FIG. 6 is a schematic plan view illustrating an example of shapes and an arrangement of, among the constituent elements of semiconductor device 1, first body region 18, second body region 28, first active region 112, and second active region 122 in the plan view. In FIG. 6, passivation layer 35, first source electrode 11, first gate electrode 19, second source electrode 21, second gate electrode 29, and interlayer insulating layer 34 are omitted as if these constituent elements are transparent in order to clearly show the structure of the top face of semiconductor layer 40 that cannot be visually recognized in reality. In addition, first source region 14 and second source region 24 are also omitted from the figure. Each pad indicated by the dashed line is shown for the sake of understanding a correspondence relation with FIG. 2 and FIG. 3.

First active region 112 refers to a minimum region that entirely encompasses a portion in which a conducting channel is formed when a voltage higher than or equal to a threshold value is applied to first gate electrode 19 (first gate conductor 15) of transistor 10. The portion in which the conducting channel is formed is a portion in which each of the plurality of first gate trenches 17 is adjacent to first source region 14. As shown in FIG. 6, in a plan view of semiconductor layer 40, first active region 112 is encompassed by first body region 18.

Second active region 122 refers to a minimum region that entirely encompasses a portion in which a conducting channel is formed when a voltage higher than or equal to a threshold value is applied to second gate electrode 29 (second gate conductor 25) of transistor 20. The portion in which the conducting channel is formed is a portion in which each of the plurality of second gate trenches 27 is adjacent to second source region 24. As shown in FIG. 6, in the plan view of semiconductor layer 40, second active region 122 is encompassed by second body region 28.

In order to reduce the conduction resistance of semiconductor device 1, it is required to expand first active region 112 and second active region 122 as much as possible. Since the conductive pathway of semiconductor device 1 widens when the area of first active region 112 and the area of second active region 122 are large, the conduction resistance of semiconductor device 1 is reduced.

First control region C1 and second control region C2 as shown in FIG. 3 are regions in which first active region 112 and second active region 122 are not provided, and are regions that do not contribute to conduction of semiconductor device 1. In other words, although first control region C1 and second control region C2 are regions necessary for semiconductor device 1 to function, these regions are regions the reduction of which is desired as much as possible in a limited device area to reduce the conduction resistance of semiconductor device 1.

[3. Discussion]

Semiconductor device 1 according to the present disclosure described above is characterized as follows.

Semiconductor device 1 according to one aspect of the present disclosure is facedown mountable, chip-size-package type semiconductor device 1, semiconductor device including: semiconductor layer 40 that includes semiconductor substrate 32; first vertical metal-oxide semiconductor (MOS) transistor 10 an entirety of which is provided in first region A1 of semiconductor layer 40, on a top face side of semiconductor layer 40; second vertical MOS transistor 20 an entirety of which is provided in second region A2 adjacent to first region A1 in a plan view of semiconductor layer 40; and metal layer 30 that is connected to and in contact with semiconductor substrate 32, on a bottom face side of semiconductor layer 40. Semiconductor substrate 32 is a common drain region of first vertical MOS transistor 10 and second vertical MOS transistor 20, in the plan view, semiconductor layer 40 is in a square shape. In the plan view, first region A1 and second region A2 are arranged in a first direction. In the plan view, border line 90 between first region A1 and second region A2 is a straight line that is orthogonal to the first direction, divides an area of semiconductor layer 40 in half, and passes through a center of semiconductor layer 40. In the plan view, first region A1 includes only one first source pad 111 and only one first gate pad 119, one first source pad 111 being connected to first source electrode 11 of first vertical MOS transistor 10, one first gate pad 119 being connected to first gate electrode 19 of first vertical MOS transistor 10. First vertical MOS transistor 10 includes: first gate resistance element 41 that is connected to first gate electrode 19; first gate electrode region G1 that is a rectangular region encompassing one first gate pad 119 in the plan view, including neither first source electrode 11 nor first gate resistance element 41, and having a largest area; and first resistance element region R1 that is a rectangular region encompassing first gate resistance element 41 in the plan view, including neither first source electrode 11 nor first gate electrode region G1, and having a largest area. In the plan view, an entire length of an outer peripheral side among outer peripheral sides of first gate electrode region G1 and an entire length of an outer peripheral side among outer peripheral sides of first resistance element region R1 match a portion of an outer peripheral side among outer peripheral sides of semiconductor layer 40, the outer peripheral side among the outer peripheral sides of semiconductor layer 40 being orthogonal to border line 90 and having a shortest distance to one first gate pad 119. In the plan view, the outer peripheral sides of first resistance element region R1 include only one corner portion among four corner portions of an outer periphery of first gate electrode region G1, the one corner portion having a shortest distance to border line 90 and a shortest distance to one of outer peripheral sides among the outer peripheral sides of semiconductor layer 40, the outer peripheral sides among the outer peripheral sides of semiconductor layer 40 being orthogonal to border line 90.

FIG. 8, FIG. 10, FIG. 11, FIG. 12, FIG. 13, and FIG. 14 each are a schematic plan view illustrating an example of shapes and an arrangement of constituent elements in semiconductor device 1 according to the present embodiment. In FIG. 8, FIG. 10, FIG. 11, FIG. 12, FIG. 13, and FIG. 14, passivation layer 35 and interlayer insulating layer 34 are omitted as if these layers are transparent in order to clearly show the structure of the top face of semiconductor layer 40 that cannot be visually recognized in reality. Although each pad indicated by the dashed line cannot be originally viewed when passivation layer 35 is omitted, the pad is left visible for the sake of clarity.

Before characteristics and effects in the shapes and the arrangement of the constituent elements shown in FIG. 8 and the subsequent figures are described, semiconductor device 2 according to Comparative Example 1 of the present embodiment is described with reference to FIG. 7A and FIG. 7B. Constituent elements of semiconductor device 2 according to Comparative Example 1 that are common to semiconductor device 1 according to the present embodiment are given the same reference signs, and the detailed description thereof is omitted as they have already been described. The following description focuses mainly on differences of semiconductor device 2 with respect to semiconductor device 1.

Although it has been explained that the ESD tolerance of the semiconductor device is improved by including the gate resistance element in the semiconductor device, a case in which a portion that makes a small contribution to conduction even though the portion is included in an active region may be formed depending on positions at which a gate electrode and a gate resistance element are disposed in a plan view of a semiconductor layer is described using semiconductor device 2 according to Comparative Example 1.

Figure 7A:
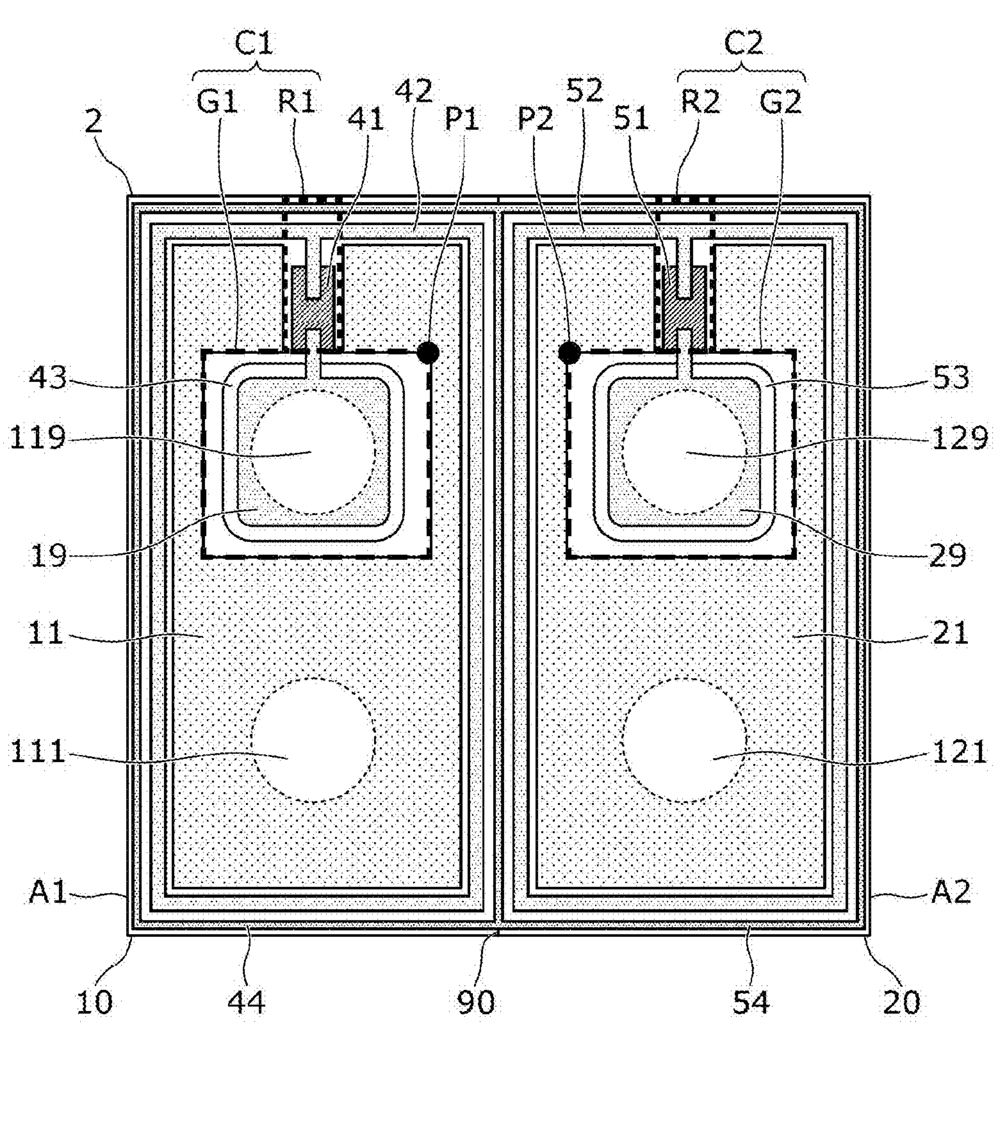
FIG. 7A is a schematic plan view illustrating shapes and an arrangement of constituent elements in a semiconductor device according to Comparative Example 1.
Figure 7A:
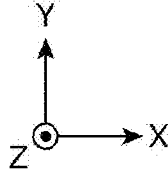

FIG. 7A is a schematic plan view illustrating shapes and an arrangement of constituent elements in semiconductor device 2, in the plan view of semiconductor layer 40. In FIG. 7A, passivation layer 35 and interlayer insulating layer 34 are omitted as if these layers are transparent in order to clearly show the structure of the top face of semiconductor layer 40 that cannot be visually recognized in reality. Although each pad indicated by the dashed line cannot be originally viewed when passivation layer 35 is omitted, the pad is left visible for the sake of clarity.

Figure 7B:
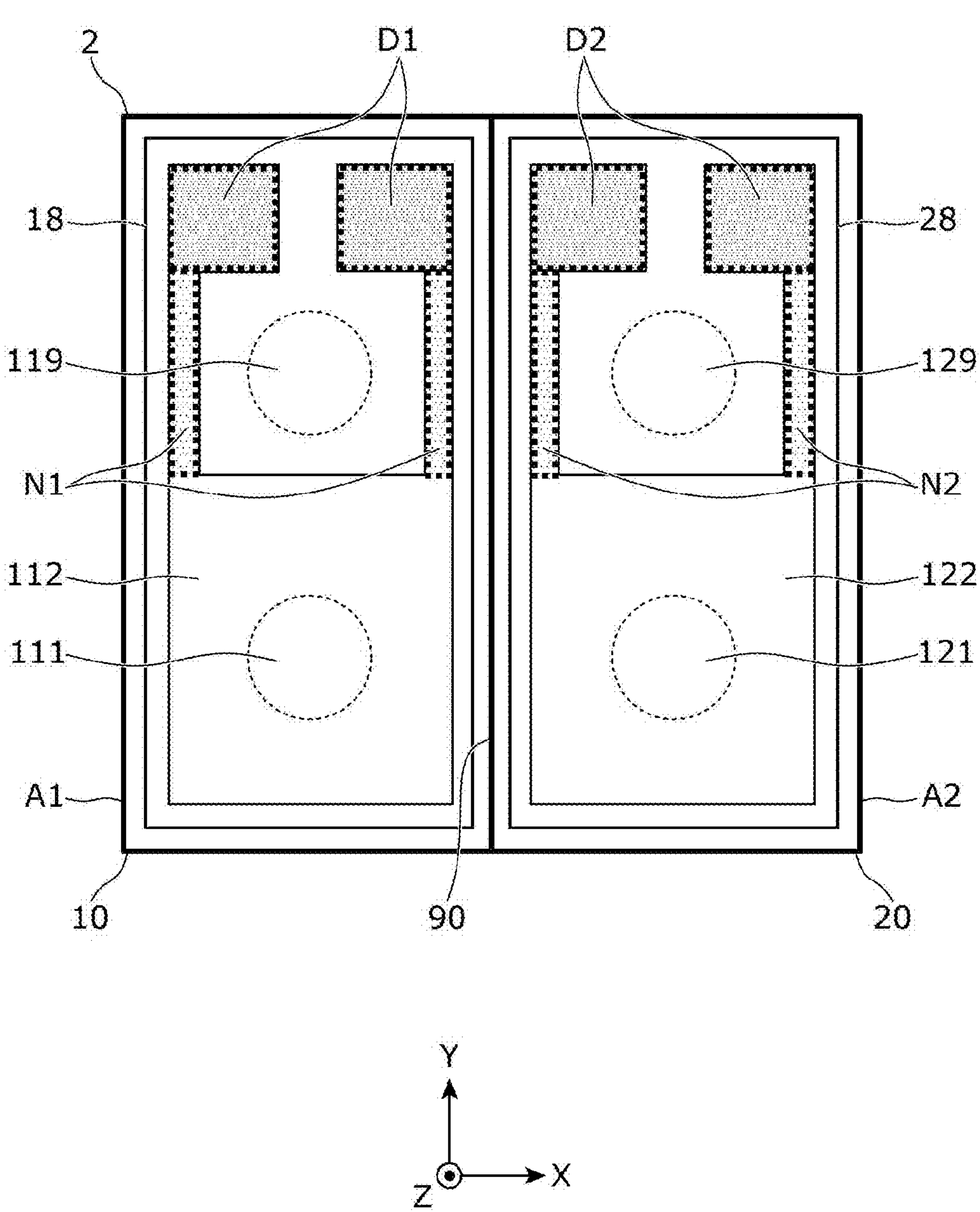
FIG. 7B is a schematic plan view illustrating shapes and an arrangement of constituent elements in the semiconductor device according to Comparative Example 1.

FIG. 7B is a schematic plan view illustrating shapes and an arrangement of, among the constituent elements of semiconductor device 2, first body region 18, second body region 28, first active region 112, and second active region 122 in the plan view. First source electrode 11, first gate electrode 19, second source electrode 21, and second gate electrode 29 are omitted from FIG. 7B in addition to the omissions in FIG. 7A. Additionally, first source region 14 and second source region 24 are also omitted from the figure.

Semiconductor layer 40 of semiconductor device 2 according to Comparative Example 1 is identical in shape and area to semiconductor layer 40 of semiconductor device 1 according to the embodiment.

As shown in FIG. 7A, in the plan view, first control region C1 that is a combination of first gate electrode region G1 and first resistance element region R1 is provided in first region A1 of semiconductor device 2. Moreover, second control region C2 that is a combination of second gate electrode region G2 and second resistance element region R2 is provided in second region A2. In the plan view, the area of first control region C1 and the area of the second control region C2 are equal to each other between semiconductor device 1 according to the embodiment and semiconductor device 2 according to Comparative Example 1 (see FIG. 3).

As shown in FIG. 7A, in the plan view, an outer peripheral side among the outer peripheral sides of first resistance element region R1 matches a portion of third side S3 of semiconductor layer 40. However, the outer peripheral sides of first gate electrode region G1 include no portion that matches the outer peripheral sides of semiconductor layer 40. Moreover, the outer peripheral sides of first resistance element region R1 do not include first corner portion P1 among the four corner portions of the outer periphery of first gate electrode region G1. It should be noted that, as with the definition for semiconductor device 1 according to the embodiment, first corner portion P1 is, among the four corner portions of the outer periphery of first gate electrode region G1, a corner portion having the shortest distance to border line 90 and the shortest distance to one of outer peripheral sides among the outer peripheral sides of semiconductor layer 40, the outer peripheral sides among the outer peripheral sides of semiconductor layer 40 being orthogonal to border line 90.

Similarly, in the plan view, an outer peripheral side among the outer peripheral sides of second resistance element region R2 matches a portion of third side S3 of semiconductor layer 40. However, the outer peripheral sides of second gate electrode region G2 include no portion that matches the outer peripheral sides of semiconductor layer 40. Moreover, the outer peripheral sides of second resistance element region R2 do not include second corner portion P2 among the four corner portions of the outer periphery of second gate electrode region G2. It should be noted that, as with the definition for semiconductor device 1 according to the embodiment, second corner portion P2 is, among the four corner portions of the outer periphery of second gate electrode region G2, a corner portion having the shortest distance to border line 90 and the shortest distance to one of outer peripheral sides among the outer peripheral sides of semiconductor layer 40, the outer peripheral sides among the outer peripheral sides of semiconductor layer 40 being orthogonal to border line 90.

The area of first active region 112 and the area of second active region 122 in a plan view of semiconductor device 2 shown in FIG. 7B are equal to the area of first active region 112 and the area of second active region 122 in a plan view of semiconductor device 1 according to the embodiment, respectively (see FIG. 6).

However, as shown in FIG. 7B, in the plan view, a region having a relatively narrow width is formed in a region between first gate electrode region G1 and border line 90 or a region between first gate electrode region G1 and first side S1 of semiconductor layer 40, in first active region 112 of semiconductor device 2. The region having the relatively narrow width between first gate electrode region G1 and border line 90 or between first gate electrode region G1 and first side S1 of semiconductor layer 40 is referred to as first narrow (narrow path) region N1.

Likewise, in the plan view, a region having a relatively narrow width is formed in a region between second gate electrode region G2 and border line 90 or a region between second gate electrode region G2 and second side S2 of semiconductor layer 40, in second active region 122 of semiconductor device 2. The region having the relatively narrow width between second gate electrode region G2 and border line 90 or between second gate electrode region G2 and second side S2 of semiconductor layer 40 is referred to as second narrow (narrow path) region N2.

Furthermore, as shown in FIG. 7B, in the plan view, first active region 112 of semiconductor device 2 includes a region that cannot be reached without passing through first narrow region N1 when viewed from first source pad 111. This region is referred to as first dead end region D1.

Similarly, in the plan view, second active region 122 of semiconductor device 2 includes a region that cannot be reached without passing through second narrow region N2 when viewed from second source pad 121. This region is referred to as second dead end region D2.

When a current flows from first source pad 111, a portion of first source electrode 11 provided near first source pad 111 is a region that has a low conduction resistance because the portion has a sufficient area, and can be used effectively for conduction.

In contrast, a current cannot reach a portion of first source electrode 11 provided in first dead end region D1 without passing through first narrow region N1 when viewed from first source pad 111. However, since a portion of first source electrode 11 provided in first narrow region N1 has a narrow width in the plan view, the conduction resistance of the portion when a current flows through the portion is relatively high. For this reason, a current does not easily flow through the portion of first source electrode 11 provided in first narrow region N1, and further the current does not also easily reach the portion of first source electrode 11 provided in first dead end region D1 on the far side of first narrow region N1.

In other words, although first narrow region N1 and first dead end region D1 both are portions of first active region 112 and include a mechanism that can contribute to conduction, first narrow region N1 and first dead end region D1 remain as regions that do not relatively easily contribute to conduction because current densities of first narrow region N1 and first dead end region D1 do not increase. The same applies to second narrow region N2 and second dead end region D2.

Accordingly, it cannot be said that semiconductor device 2 according to Comparative Example 1 includes an arrangement that is capable of making full effective use of a remaining limited area after first control region C1 and second control region C2 are disposed in the plan view, to reduce conduction resistance. To reduce conduction resistance, it is desirable to achieve an arrangement in which first narrow region N1, second narrow region N2, first dead end region D1, and second dead end region D2 whose contribution to conduction is relatively small are not formed as much as possible.

As shown in FIG. 3, in semiconductor device 1 according to the present disclosure, since first gate electrode region G1 and first resistance element region R1 are arranged to cause the entire length of the outer peripheral side among the outer peripheral sides of each of first gate electrode region G1 and first resistance element region R1 to match the portion of third side S3 of semiconductor layer 40 in the plan view, first dead end region D1 is not formed.

Likewise, in semiconductor device 1 according to the present disclosure, since second gate electrode region G2 and second resistance element region R2 are arranged to cause the entire length of the outer peripheral side among the outer peripheral sides of each of second gate electrode region G2 and second resistance element region R2 to match the portion of third side S3 of semiconductor layer 40 in the plan view, second dead end region D2 is not formed.

For this reason, although semiconductor device 1 has the same area of the active region, semiconductor device 1 is capable of increasing an area whose contribution to conduction is relatively large, compared to semiconductor device 2 according to Comparative Example 1. To put it another way, semiconductor device 1 includes an arrangement that is capable of making effective use of the limited area of semiconductor device 1, and it is possible to reduce conduction resistance.

In the case where semiconductor device 1 is facedown mounted on a mounting substrate, when a distance between two of the pads included in semiconductor device 1 is short, there is a possibility that solders that join semiconductor device 1 and the mounting substrate come into contact with each other. For this reason, with regard to the distance between the two of the pads included in semiconductor device 1, it is necessary to maintain a certain distance. As a non-limiting example, a certain distance is a distance identical to the diameter of any of the pads included in semiconductor device 1.

Figure 8:
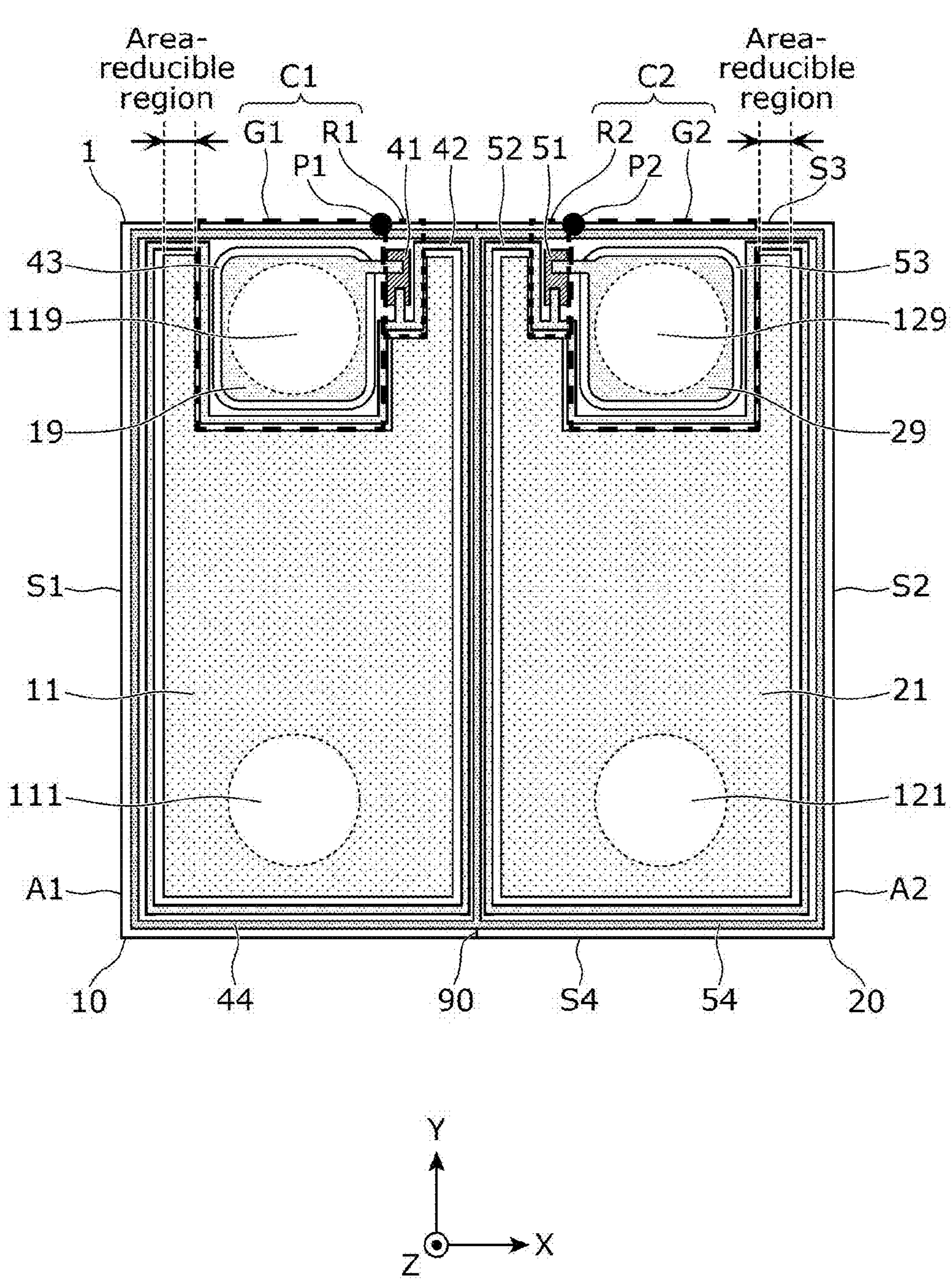
FIG. 8 is a schematic plan view illustrating an example of shapes and an arrangement of constituent elements in the semiconductor device according to the embodiment.

In consideration of the above reason, as shown in FIG. 8, in semiconductor device 1, first resistance element region R1 may be disposed between border line 90 and the outer peripheral side having the shortest distance to border line 90 among the outer peripheral sides of first gate electrode region G1 in the plan view of semiconductor layer 40. More favorably, first resistance element region R1 may be disposed to cause the entire length of an outer peripheral side among the outer peripheral sides of first resistance element region R1 to match a portion of the outer peripheral side having the shortest distance to border line 90 among the outer peripheral sides of first gate electrode region G1.

Similarly, second resistance element region R2 may be disposed between border line 90 and the outer peripheral side having the shortest distance to border line 90 among the outer peripheral sides of second gate electrode region G2. More favorably, second resistance element region R2 may be disposed to cause the entire length of an outer peripheral side among the outer peripheral sides of second resistance element region R2 to match a portion of the outer peripheral side having the shortest distance to border line 90 among the outer peripheral sides of second gate electrode region G2.

Such arrangements make it possible to economically use, as a region in which first gate resistance element 41 and second gate resistance element 51 are arranged, a region between first gate pad 119 and second gate pad 129 that is provided to prevent a mounting failure caused by solders coming into contact with each other.

The above advantage is described in a little more detail below.

In FIG. 8, area-reducible regions are indicated on both ends of semiconductor device 1 in the X direction. If there is a further demand for downsizing semiconductor device 1, these regions are regions whose area can be reasonably reduced. As described above, the region between first gate pad 119 and second gate pad 129 needs to keep a certain distance to prevent the solders from coming into contact with each other, and it is not advisable to reduce the region excessively.

Accordingly, in FIG. 8, in the plan view, in first active region 112 (or first source electrode 11), an end portion of semiconductor device 1 in the X direction is a region whose area can be easily reduced. In the plan view, in first region A1, the end portion is a region in a belt shape in the Y direction between first side S1 of semiconductor layer 40 and an outer peripheral side having the shortest distance to first side S1 of semiconductor layer 40 among the outer peripheral sides of first gate electrode region G1.

Likewise, in the plan view, in second active region 122 (or second source electrode 21), an end portion of semiconductor device 1 in the X direction is a region whose area can be easily reduced. In the plan view, in second region A2, the end portion is a region in a belt shape in the Y direction between second side S2 of semiconductor layer 40 and an outer peripheral side having the shortest distance to second side S2 of semiconductor layer 40 among the outer peripheral sides of second gate electrode region G2.

In other words, in semiconductor device 1 according to the present embodiment shown in FIG. 8, since first resistance element region R1 and second resistance element region R2 are disposed between first gate electrode region G1 and second gate electrode region G2, it is also possible to meet a demand for further reducing the area of semiconductor layer 40, that is, downsizing semiconductor device 1.

Next, semiconductor device 3 to semiconductor device 7 according to Comparative Example 2 to Comparative Example 6 of the present embodiment are described with reference to FIG. 9A to FIG. 9E. Constituent elements of semiconductor device 3 to semiconductor device 7 according to Comparative Example 2 to Comparative Example 6 that are common to semiconductor device 1 are given the same reference signs, and the detailed description thereof is omitted as they have already been described. The following description focuses mainly on differences of semiconductor device 3 to semiconductor device 7 with respect to semiconductor device 1.

The following describes an advantage of the outer peripheral sides of first resistance element region R1 and the outer peripheral sides of second resistance element R2 including only first corner portion P1 of the outer periphery of first gate electrode region G1 and only second corner portion P2 of the outer periphery of second gate electrode region G2, respectively, by reference to Comparative Example 2 to Comparative Example 6 shown in FIG. 9A to FIG. 9E.

FIG. 9A to FIG. 9E each are a schematic plan view illustrating shapes and an arrangement of constituent elements of a corresponding one of semiconductor device 3 to semiconductor device 7 in the plan view of semiconductor layer 40. Moreover, in FIG. 9A to FIG. 9E, for the sake of clarity, among the constituent elements of semiconductor device 3 to semiconductor device 7, only first region A1 of semiconductor layer 40 is separated and further only first source electrode 11, first source pad 111, first gate pad 119, first gate electrode region G1, and first resistance element region R1 are shown, and constituent elements other than those above are omitted. It can be safely considered that shapes and an arrangement of constituent elements in second region A2 of semiconductor layer 40 in a plan view have a line symmetrical relation to shapes and an arrangement of constituent elements in first region A1 in the plan view on a one-to-one basis with respect to border line 90 as a symmetric axis.

In semiconductor device 3 to semiconductor device 7 according to Comparative Example 2 to Comparative Example 6, first region A1 of semiconductor layer 40 is identical to first region A1 of semiconductor layer 40 of semiconductor device 1 in shape and area in the plan view. In addition, first gate electrode region G1, first resistance element region R1, first active region 112, first source pad 111, etc. are identical to the corresponding regions, pad, etc. in area.

As shown in FIG. 9A to FIG. 9E, what is common to semiconductor device 3 to semiconductor device 7 according to Comparative Example 2 to Comparative Example 6 is that the entire length of an outer peripheral side among outer peripheral sides of first gate electrode region G1 matches a portion of third side S3 of semiconductor layer 40.

Figure 9A:
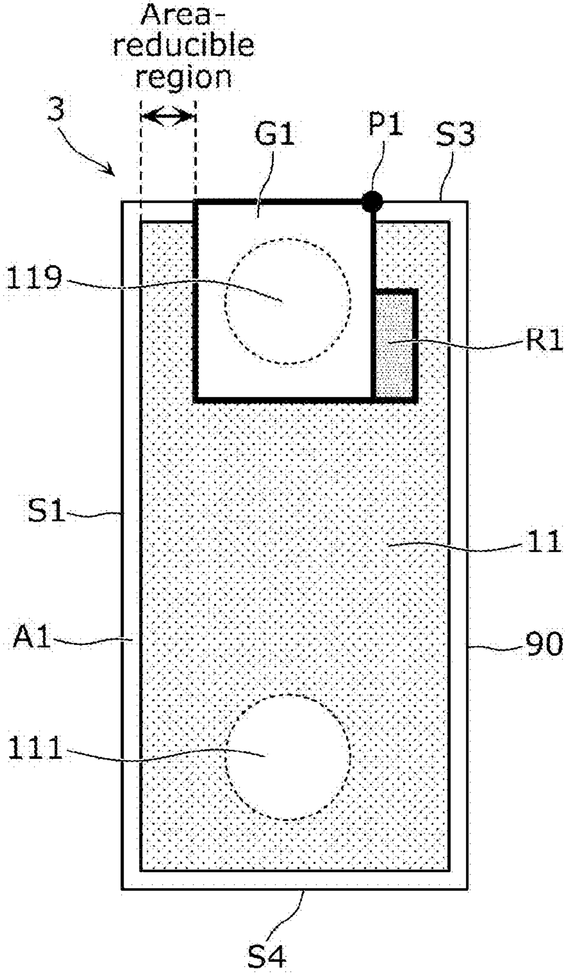
FIG. 9A is a schematic plan view illustrating an arrangement of constituent elements in a semiconductor device according to Comparative Example 2.
Figure 9A:
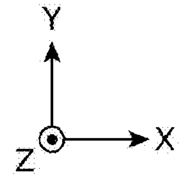

FIG. 9A is a schematic plan view of semiconductor device 3 according to Comparative Example 2. In the plan view, in semiconductor device 3, among the four corner portions of the outer periphery of first gate electrode region G1, only one corner portion having the shortest distance to border line 90 but not having the shortest distance to third side S3 of semiconductor layer 40 (i.e., having the shortest distance to fourth side S4 of semiconductor layer 40) is included in the outer peripheral sides of first resistance element region R1. Additionally, in the plan view, in semiconductor device 3, first resistance element region R1 is disposed in a region between first gate electrode region G1 and border line 90.

Accordingly, in the arrangement shown in FIG. 9A, first dead end region D1 is formed in semiconductor device 3. For this reason, compared to semiconductor device 1 according to the embodiment (FIG. 8), even though first active region 112 has the same area, it can be said that such an arrangement makes it difficult to reduce conduction resistance.

Figure 9B:
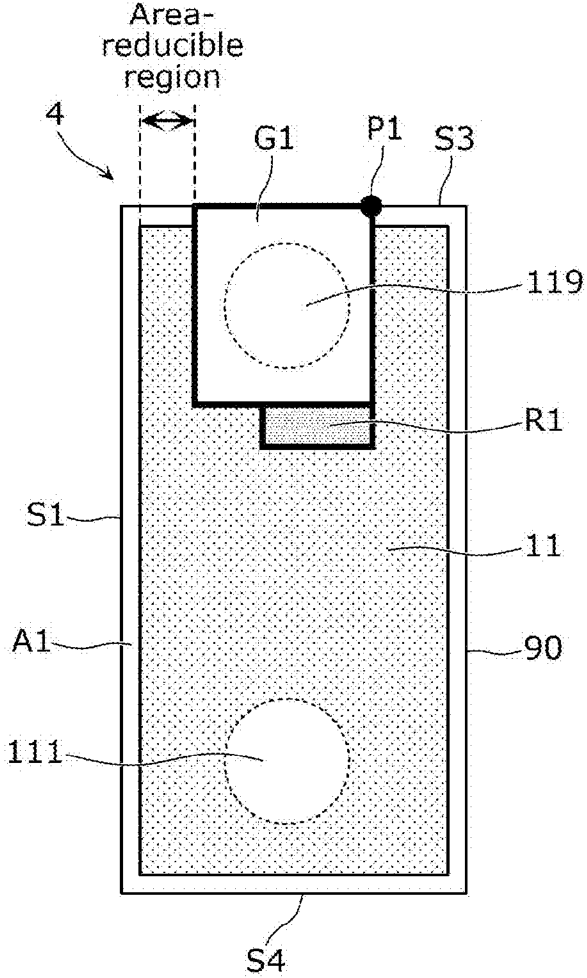
FIG. 9B is a schematic plan view illustrating an arrangement of constituent elements in a semiconductor device according to Comparative Example 3.
Figure 9B:
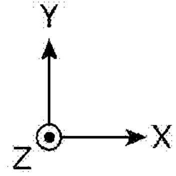

FIG. 9B is a schematic plan view of semiconductor device 4 according to Comparative Example 3. In semiconductor device 4, among the four corner portions of the outer periphery of first gate electrode region G1, only one corner portion having the shortest distance to border line 90 but not having the shortest distance to third side S3 of semiconductor layer 40 (i.e., having the shortest distance to fourth side S4 of semiconductor layer 40) is included in the outer peripheral sides of first resistance element region R1 in the plan view.

Figure 9C:
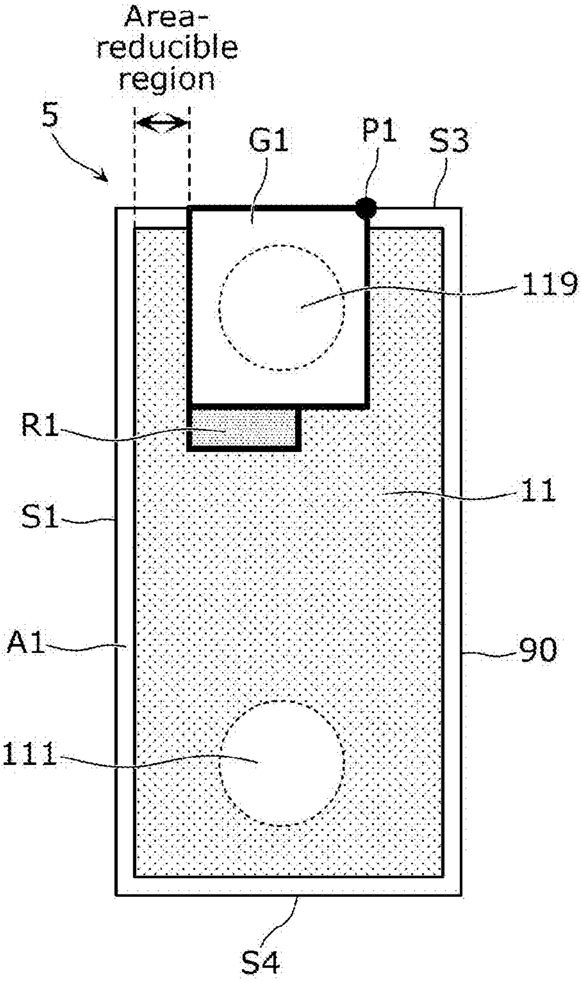
FIG. 9C is a schematic plan view illustrating an arrangement of constituent elements in a semiconductor device according to Comparative Example 4.
Figure 9C:
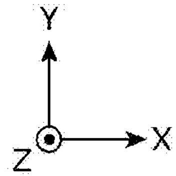

FIG. 9C is a schematic plan view of semiconductor device 5 according to Comparative Example 4. In semiconductor device 5, among the four corner portions of the outer periphery of first gate electrode region G1, only one corner portion having the shortest distance to first side S1 of semiconductor layer 40 and the shortest distance to fourth side S4 of semiconductor layer 40 is included in the outer peripheral sides of first resistance element region R1.

Additionally, in semiconductor device 4 and semiconductor device 5, first resistance element region R1 is disposed in a region between first gate electrode region G1 and first source pad 111 in the plan view.

Accordingly, in the arrangement in semiconductor device 4 shown in FIG. 9B and the arrangement in semiconductor device 5 shown in FIG. 9C, a portion of a region near first source pad 111 whose contribution to conduction is relatively large is intentionally disposed as first resistance element region R1 that does not contribute to conduction. For this reason, compared to semiconductor device 1 according to the embodiment (FIG. 8), even though first active region 112 has the same area, it can be said that such arrangements make it difficult to reduce conduction resistance.

Figure 9D:
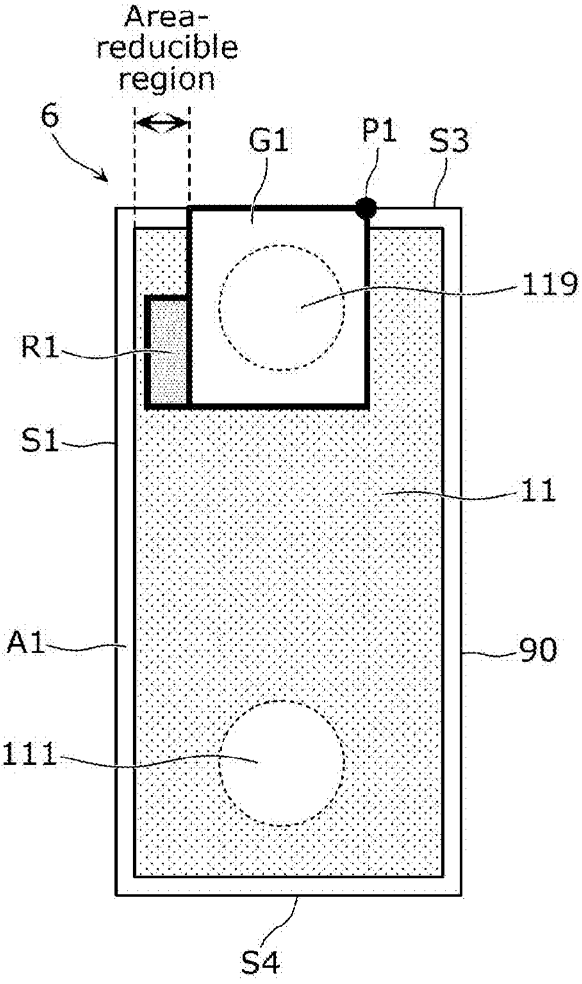
FIG. 9D is a schematic plan view illustrating an arrangement of constituent elements in a semiconductor device according to Comparative Example 5.
Figure 9D:
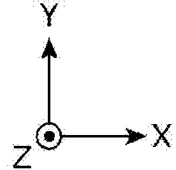

FIG. 9D is a schematic plan view of semiconductor device 6 according to Comparative Example 5. In semiconductor device 6, among the four corner portions of the outer periphery of first gate electrode region G1, only one corner portion having the shortest distance to first side S1 of semiconductor layer 40 and the shortest distance to fourth side S4 of semiconductor layer 40 is included in the outer peripheral sides of first resistance element region R1 in the plan view.

Figure 9E:
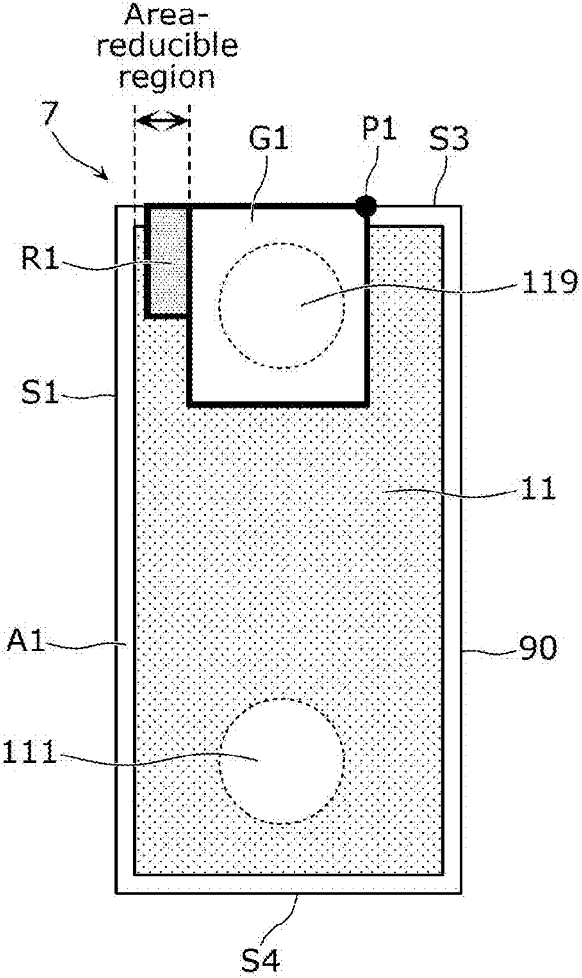
FIG. 9E is a schematic plan view illustrating an arrangement of constituent elements in a semiconductor device according to Comparative Example 6.
Figure 9E:
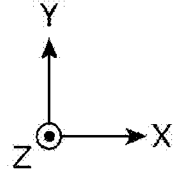

FIG. 9E is a schematic plan view of semiconductor device 7 according to Comparative Example 6. In semiconductor device 7, among the four corner portions of the outer periphery of first gate electrode region G1, only one corner portion having the shortest distance to third side S3 of semiconductor layer 40 but not having the shortest distance to border line 90 (i.e., having the shortest distance to first side S1 of semiconductor layer 40) is included in the outer peripheral sides of first resistance element region R1 in the plan view.

Additionally, in semiconductor device 6 and semiconductor device 7, first resistance element region R1 is disposed in a region between first gate electrode region G1 and first side S1 of semiconductor layer 40 in the plan view.

Accordingly, in the arrangement in semiconductor device 6 shown in FIG. 9D and the arrangement in semiconductor device 7 shown in FIG. 9E, as described with reference to FIG. 8, it is not possible to respond to a situation when there is a demand for reducing the area of semiconductor layer 40 (downsizing semiconductor device 1).

In addition, in the arrangement shown in FIG. 9D, first dead end region D1 is formed in semiconductor device 6. For this reason, compared to semiconductor device 1 according to the embodiment (FIG. 8), even though first active region 112 has the same area, it can be said that such an arrangement makes it difficult to reduce conduction resistance.

As stated above, as with semiconductor device 1 according to the present embodiment shown in FIG. 3 or FIG. 8, most favorably, among the four corner portions of the outer periphery of first gate electrode region G1, only one corner portion (first corner portion P1) having the shortest distance to border line 90 and the shortest distance to third side S3 of semiconductor layer 40 may be included in the outer peripheral sides of first resistance element region R1 in the plan view.

Likewise, most favorably, among the four corner portions of the outer periphery of second gate electrode region G2, only one corner portion (second corner portion P2) having the shortest distance to border line 90 and the shortest distance to third side S3 of semiconductor layer 40 may be included in the outer peripheral sides of second resistance element region R2 in the plan view.

The above-described arrangement allows semiconductor device 1 according to the present embodiment to increase a rate at which the active regions having a limited area are used as efficiently as possible and to reduce the conduction resistance while ensuring the ESD tolerance by semiconductor device 1 including the gate resistance elements. In addition, the arrangement is capable of providing a margin to meet the demand for downsizing semiconductor device 1.

As shown in FIG. 8, in semiconductor device 1 according to the present embodiment, transistor 10 and transistor 20 are arranged line-symmetrically with respect to border line 90 as the symmetric axis in the plan view of semiconductor layer 40. Accordingly, unbalanced electrical characteristics in bidirectional conduction and unbalanced heat dissipation hardly occur between transistor 10 and transistor 20.

Consequently, in semiconductor device 1, as with the above-described configuration, transistor 10 and transistor 20 may be arranged line-symmetrically with respect to border line 90 as the symmetric axis. For this reason, unbalanced electrical characteristics due to a difference in current direction and unbalanced heat dissipation do not occur easily. For example, when a protection circuit including semiconductor device 1 is included in a lithium-ion battery pack of a smartphone, a tablet, etc., the need for specially providing, either in charging or in discharging, a difference relating to a direction of conduction in semiconductor device 1 is eliminated.

In other words, in the plan view, second region A2 may include only one second source pad 121 and only one second gate pad 129, one second source pad 121 being connected to second source electrode 21 of second vertical MOS transistor 20, one second gate pad 129 being connected to second gate electrode 29 of second vertical MOS transistor 20. Second vertical MOS transistor 20 may include: second gate resistance element 51 that is connected to second gate electrode 29; second gate electrode region G2 that is a rectangular region encompassing one second gate pad 129 in the plan view, including neither second source electrode 21 nor second gate resistance element 51, and having a largest area; and second resistance element region R2 that is a rectangular region encompassing second gate resistance element 51 in the plan view, including neither second source electrode 21 nor second gate electrode region G2, and having a largest area. In the plan view, an entire length of an outer peripheral side among outer peripheral sides of second gate electrode region G2 and an entire length of an outer peripheral side among outer peripheral sides of second resistance element region R2 may match a portion of an outer peripheral side among outer peripheral sides of semiconductor layer 40, the outer peripheral side among the outer peripheral sides of semiconductor layer 40 being orthogonal to border line 90 and having a shortest distance to one second gate pad 129. In the plan view, the outer peripheral sides of second resistance element region R2 may include only one corner portion (second corner portion P2) among four corner portions of an outer periphery of second gate electrode region G2, the one corner portion having a shortest distance to border line 90 and a shortest distance to one of outer peripheral sides among the outer peripheral sides of semiconductor layer 40, the outer peripheral sides among the outer peripheral sides of semiconductor layer 40 being orthogonal to border line 90. In the plan view, (i) one second source pad 121, one second gate pad 129, second gate electrode region G2, and second resistance element region R2 and (ii) one first source pad 111, one first gate pad 119, first gate electrode region G2, and first resistance element region R1 may be arranged line-symmetrically with respect to border line 90 as a symmetrical axis, respectively.

Figure 10:
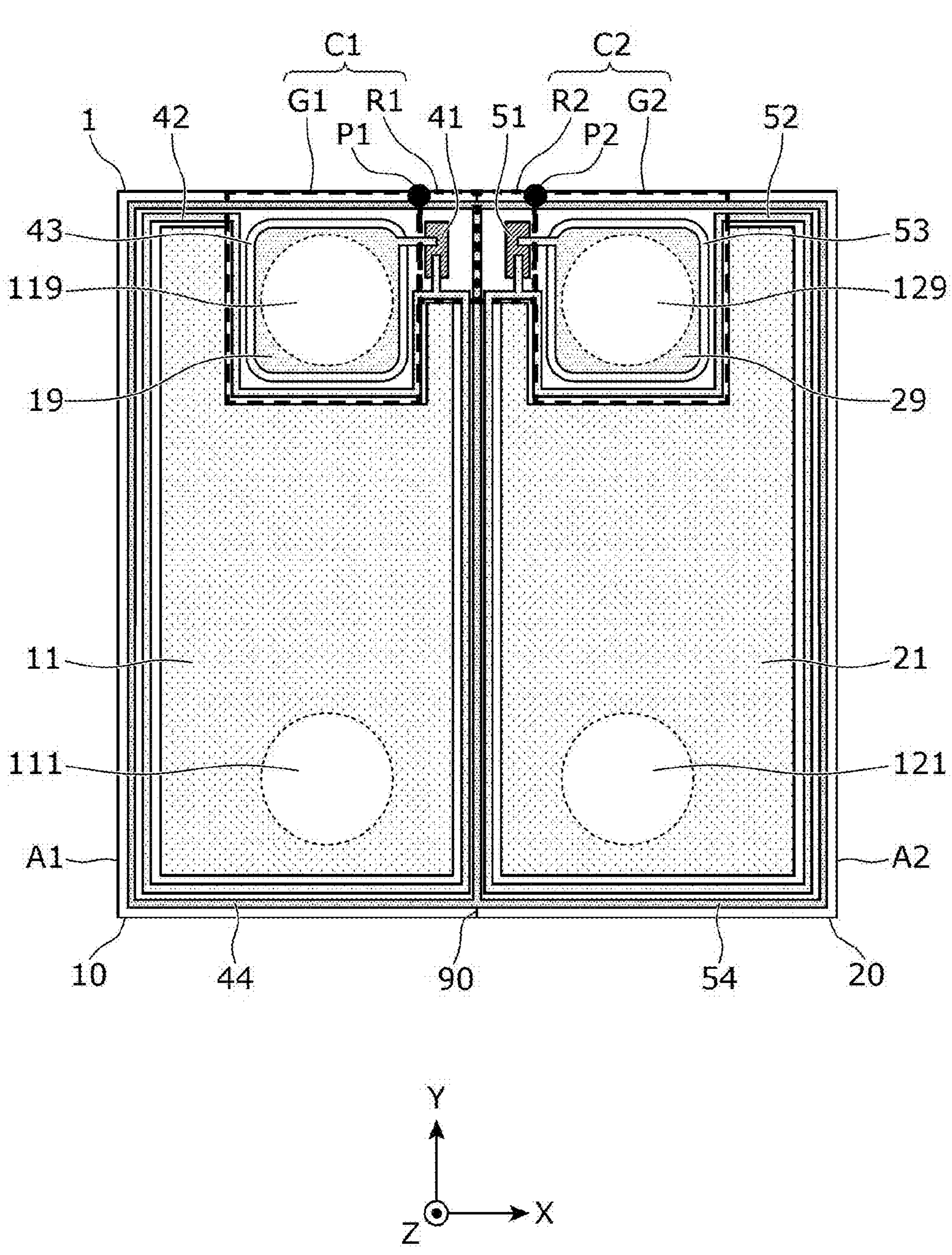
FIG. 10 is a schematic plan view illustrating an example of shapes and an arrangement of constituent elements in the semiconductor device according to the embodiment.

As shown in FIG. 10, in the plan view of semiconductor layer 40, the entire length of an outer peripheral side among the outer peripheral sides of first resistance element region R1 may be matched to a portion of border line 90, and the entire length of an outer peripheral side among the outer peripheral sides of second resistance element region R2 may be matched to a portion of border line 90.

According to the above-described configuration, compared to semiconductor device 2 according to Comparative Example 1 shown in FIG. 7A, semiconductor device 1 is capable of preventing first dead end region D1 and second dead end region D2 from forming, and reducing the area of first narrow region N1 and the area of second narrow region N2. For this reason, since a region capable of effectively contributing to conduction of semiconductor device 1 expands, it is possible to reduce the conduction resistance of semiconductor device 1.

Figure 11:
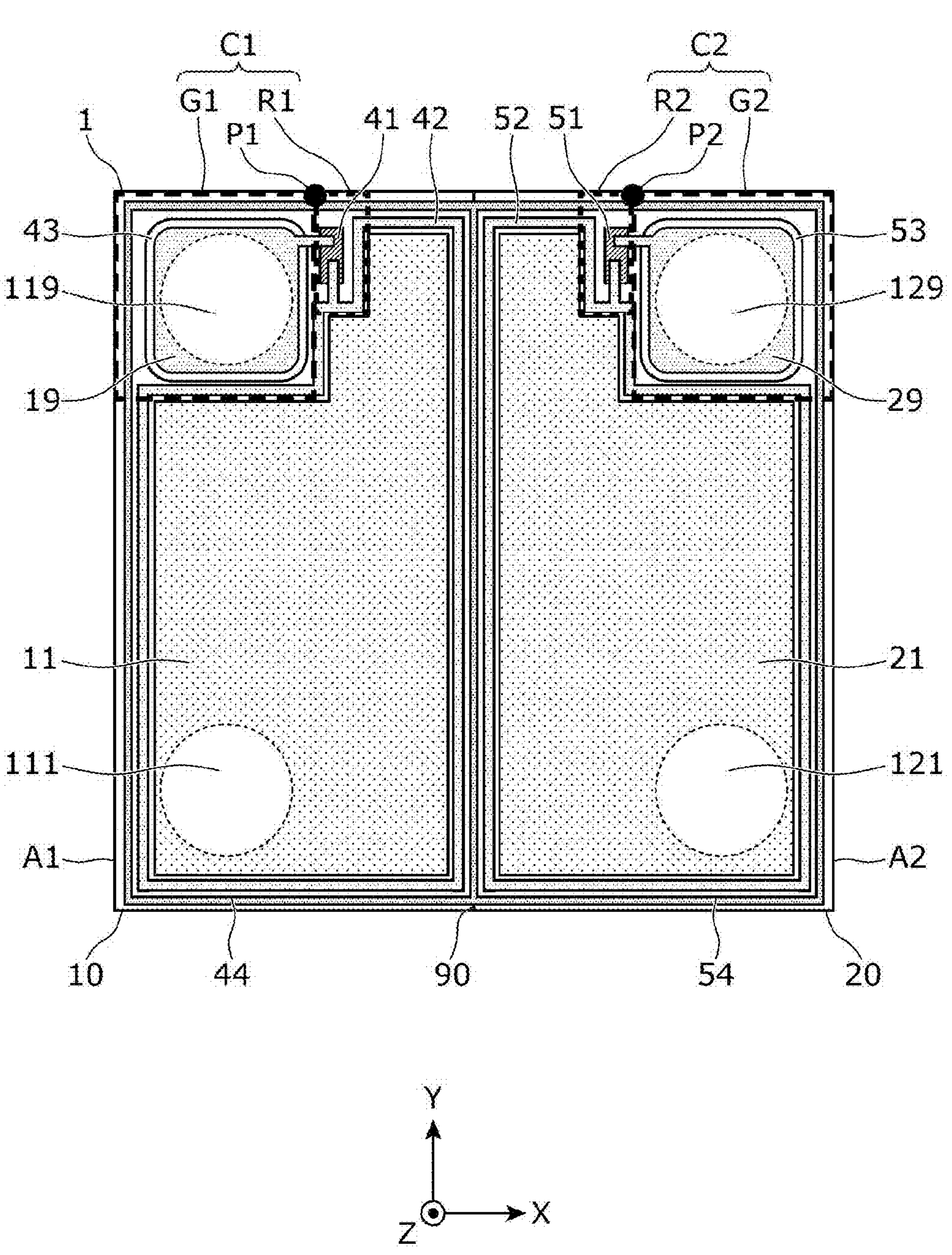
FIG. 11 is a schematic plan view illustrating an example of shapes and an arrangement of constituent elements in the semiconductor device according to the embodiment.

Moreover, as shown in FIG. 11, in the plan view of semiconductor layer 40, the entire length of an outer peripheral side among the outer peripheral sides of first gate electrode region G1 may be matched to a portion of first side S1 parallel to border line 90 among the outer peripheral sides of semiconductor layer 40, and the entire length of an outer peripheral side among the outer peripheral sides of second electrode region G2 may be matched to a portion of second side S2 parallel to border line 90 among the outer peripheral sides of semiconductor layer 40.

According to the above-described configuration, compared to semiconductor device 2 according to Comparative Example 1 shown in FIG. 7A, semiconductor device 1 is capable of preventing first dead end region D1 and second dead end region D2 from forming, and reducing the area of first narrow region N1 and the area of second narrow region N2. For this reason, since a region capable of effectively contributing to conduction of semiconductor device 1 expands, it is possible to reduce the conduction resistance of semiconductor device 1.

It should be noted that a comparison of the arrangement shown in FIG. 11 with the arrangement shown in FIG. 10 shows that in the plan view, the respective widths of first active region 112 (or first source electrode 11) and second active region 122 (or second source electrode 21) in the X direction on a side closer to border line 90 are increased in FIG. 11. Additionally, first active region 112 (or first source electrode 11) and second active region 122 (or second source electrode 21) occupy the entire length of border line 90 in the Y direction, except for placement margins.

Since a current density becomes highest in an opposing region in which first region A1 and second region A2 are located opposite each other across border line 90, it is desirable to use the entire length of the opposing region in the Y direction for conduction. In other words, the opposing region may be occupied by first active region 112 (or first source electrode 11) and second active region 122 (or second source electrode 21). In the arrangement shown in FIG. 11, since it is possible to effectively use the entire length of the opposing region in the Y direction, it is possible to achieve especially an effect of reducing conduction resistance.

Instead of the entire length of the opposing region in the Y direction, a portion of the opposing region in the Y direction that is as long as possible may be effectively used. For this reason, in the plan view, an outer peripheral side of first source electrode 11 may be made longest in a portion closest to border line 90. In the plan view, at least the length of the portion closest to border line 90 in an outer peripheral side of first source electrode 11 may be made greater than the length of a portion closest to first side S1 of semiconductor layer 40 in an outer peripheral side of first source electrode 11.

Similarly, in the plan view, an outer peripheral side of second source electrode 21 may be made longest in a portion closest to border line 90. In the plan view, at least the length of the portion closest to border line 90 in an outer peripheral side of second source electrode 21 may be made greater than the length of a portion closest to second side S2 of semiconductor layer 40 in an outer peripheral side of second source electrode 21.

It is possible to achieve the above-described configuration using the arrangement as shown in FIG. 3 or FIG. 11. In particular, in the arrangement shown in FIG. 11, since first source electrode 11 and second source electrode 21 occupy the entire length of the opposing region along border line 90 in the Y direction, except for the placement margins, it is possible to achieve especially an effect of reducing conduction resistance.

Moreover, as shown in FIG. 3, the entire length of an outer peripheral side among the outer peripheral sides of first control region C1 may be matched to a half of third side S3 of semiconductor layer 40, and the entire length of an outer peripheral side among the outer peripheral sides of second control region C2 may be matched to a half of third side S3 of semiconductor layer 40.

It should be noted that the above-described configuration is rephrased as a total length of the length over which the outer peripheral side of first control region C1 and the portion of third side S3 of semiconductor layer 40 match and the length over which the outer peripheral side of second control region C2 and the portion of third side S3 of semiconductor layer 40 match being equal to the length of an outer peripheral side (the length of third side S3) among the outer peripheral sides of semiconductor layer 40.

For that matter, in the plan view, among lengths of portions in each of which an outer peripheral side of first control region C1 and an outer peripheral side of semiconductor layer 40 match, a length of a portion in which an outer peripheral side of first control region C1 and third side S3 of semiconductor layer 40 match is greatest, and among lengths of portions in each of which an outer peripheral side of second control region C2 and an outer peripheral side of semiconductor layer 40 match, a length of a portion in which an outer peripheral side of second control region C2 and third side S3 of semiconductor layer 40 match is greatest.

According to the above-described configuration, semiconductor device 1 is capable of preventing first dead end region D1 and second dead end region D2 from forming, compared to semiconductor device 2 according to Comparative Example 1 shown in FIG. 7A and FIG. 7B, and reducing the area of first narrow region N1 and the area of second narrow region N2 to the maximum, compared to the embodiment shown in FIG. 8 and FIG. 10. For this reason, a region whose contribution to conduction of semiconductor device 1 is high expands, and it is possible to dramatically reduce the conduction resistance of semiconductor device 1.

Figure 12:
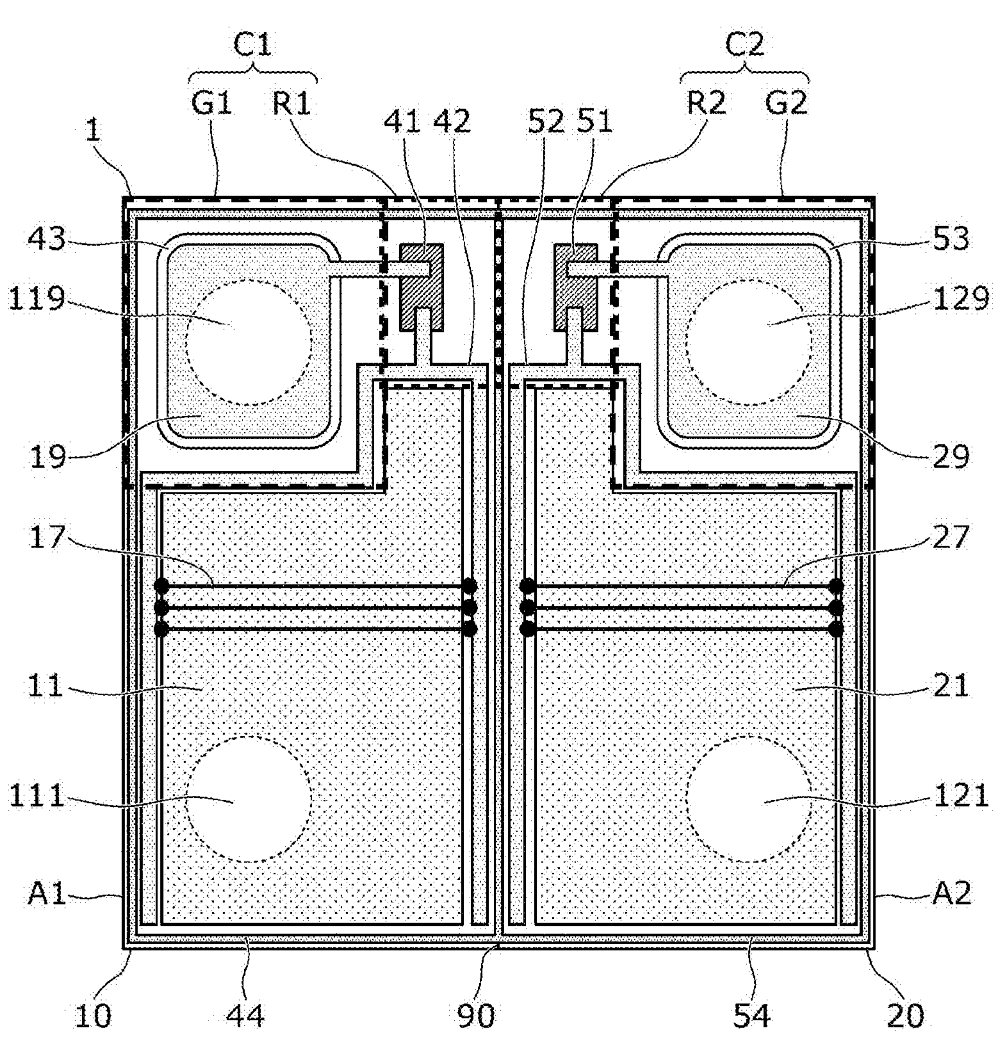
FIG. 12 is a schematic plan view illustrating an example of shapes and an arrangement of constituent elements in the semiconductor device according to the embodiment.
Figure 12:
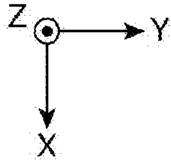
Figure 13:
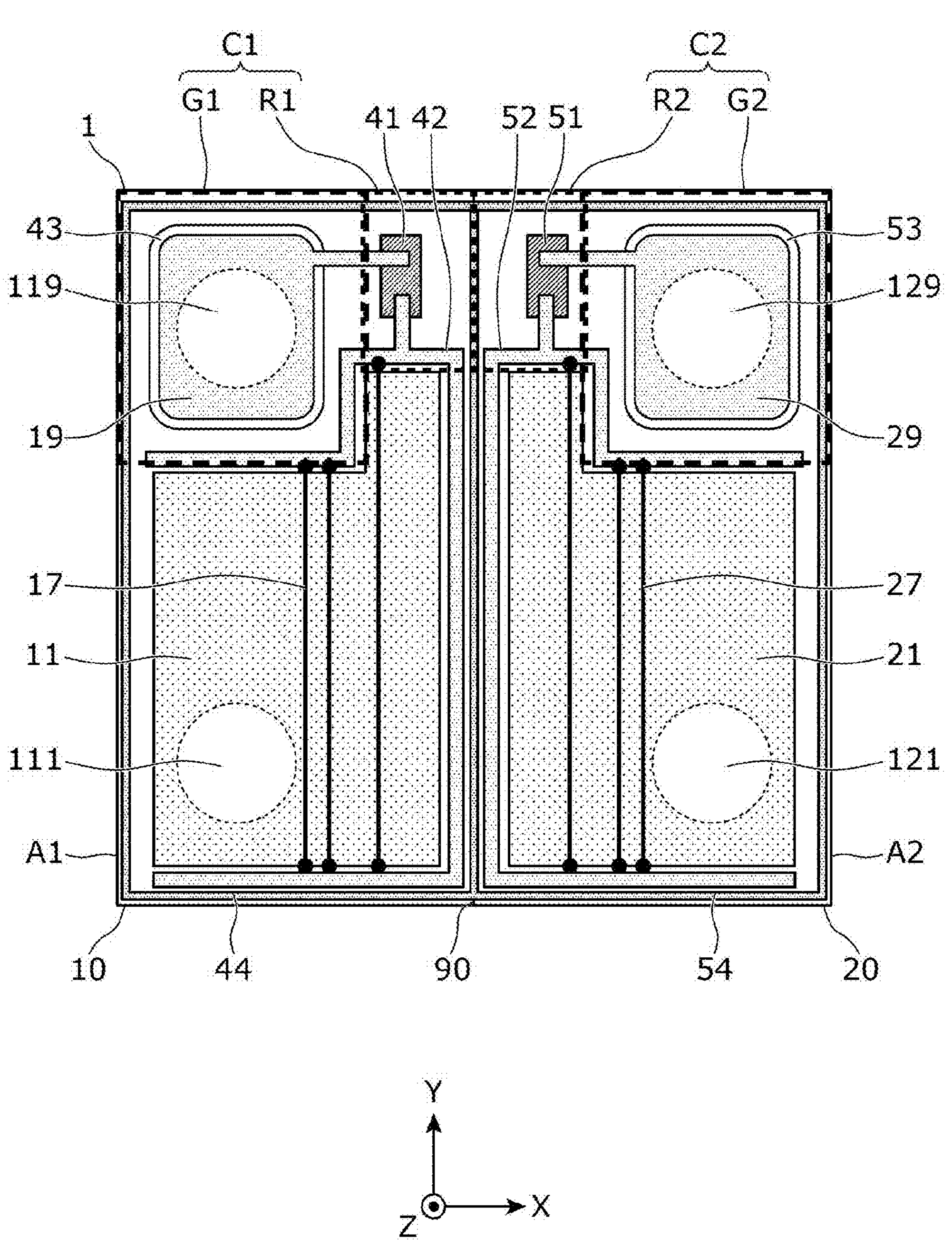
FIG. 13 is a schematic plan view illustrating an example of shapes and an arrangement of constituent elements in the semiconductor device according to the embodiment.

In semiconductor device 1 shown in FIG. 12, FIG. 13, and FIG. 14, portions of first gate trenches 17 and portions of second gate trenches 27 are schematically shown by straight lines and circles at both ends of the straight lines. A straight line shows a gate trench, and an extension direction of the straight line is an extension direction of the gate trench. The circles at both ends each indicate a portion in which a gate conductor embedded in a trench is connected to gate wiring.

In semiconductor device 1 shown in FIG. 12, first gate trenches 17 and second gate trenches 27 extend in a direction orthogonal to border line 90 in the plan view. In this case, first gate wiring 42 and second gate wiring 52 may be disposed to surround first source electrode 11 and second source electrode 21, respectively, except for portions closest to fourth side S4 of semiconductor layer 40.

In the plan view, in order for first gate electrode 19 and first gate conductor 15 to be connected, first gate wiring 42 may be disposed on an extended line along which first gate trenches 17 extend. Likewise, in order for second gate electrode 29 and second gate conductor 25 to be connected, second gate wiring 52 may be disposed on an extended line along which second gate trenches 27 extend. Accordingly, when first gate trenches 17 and second gate trenches 27 extend in the direction orthogonal to border line 90, no inconvenience is caused even if first gate wiring 42 and second gate wiring 52 are not disposed in the portions closest to fourth side S4 of semiconductor layer 40, respectively.

According to the above-described configuration, since it is possible to expand first active region 112 and second active region 122 as much as first gate wiring 42 and second gate wiring 52 are not disposed in the portions closest to fourth side S4 of semiconductor layer 40, respectively, it is possible to reduce the conduction resistance of semiconductor device 1.

In semiconductor device 1 shown in FIG. 13, first gate trenches 17 extend in a direction parallel to border line 90 in the plan view. In this case, first gate wiring 42 may be disposed to surround first source electrode 11, except for a portion closest to first side S1 of semiconductor layer 40. Similarly, in an arrangement shown in FIG. 13, second gate trenches 27 extend in the direction parallel to border line 90 in the plan view. In this case, second gate wiring 52 may be disposed to surround second source electrode 21, except for a portion closest to second side S2 of semiconductor layer 40.

According to the above-described configuration, since it is possible to expand first active region 112 and second active region 122 as much as first gate wiring 42 and second gate wiring 52 are not disposed in the portion closest to first side S1 of semiconductor layer 40 and the portion closest to second side S2 of semiconductor layer 40, respectively, it is possible to reduce the conduction resistance of semiconductor device 1.

As shown in FIG. 14, in semiconductor device 1, a first connection region that connects first Zener diode 43 and first source electrode 11 may include, in the plan view, a portion overlapping, among the outer peripheral sides of first gate electrode region G1, only an outer peripheral side across which first gate electrode region G1 and first source electrode 11 are located opposite each other and that is parallel to the direction in which first gate trenches 17 extend.

Likewise, a second connection region that connects second Zener diode 53 and second source electrode 21 may include, in the plan view, a portion overlapping, among the outer peripheral sides of second gate electrode region G2, only an outer peripheral side across which second gate electrode region G2 and second source electrode 21 are located opposite each other and that is parallel to the direction in which second gate trenches 27 extend.

According to the above-described configuration, in the plan view of semiconductor layer 40, it is possible to connect first Zener diode 43 and first source electrode 11 without blocking a region that connects first gate wiring 42 and first gate conductor 15. Similarly, it is possible to connect second Zener diode 53 and second source electrode 21 without blocking a region that connects second gate wiring 52 and second gate conductor 25.

For this reason, in the plan view, since it is possible to prevent the reduction of the area of first active region 112 and the area of second active region 122, it is possible to reduce the conduction resistance of semiconductor device 1.

Although the semiconductor device according to one aspect of the present disclosure has been described above based on the embodiment and Comparative Examples 1 to 6, the present disclosure is not limited to the embodiment. Forms obtained by various modifications to the respective embodiments that can be conceived by a person skilled in the art as well as forms realized by combining constituent elements in different embodiments and variations are included in the scope of one or more aspects of the present disclosure, as long as they do not depart from the essence of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device including the vertical MOS transistor according to the present disclosure is widely applicable as a device that controls a conducting state of a current pathway.

The invention claimed is:

1. A semiconductor device that is a facedown mountable, chip-size-package type semiconductor device, the semiconductor device comprising:

- a semiconductor layer that includes a semiconductor substrate;
- a first vertical metal-oxide semiconductor (MOS) transistor an entirety of which is provided in a first region of the semiconductor layer, on a top face side of the semiconductor layer;
- a second vertical MOS transistor an entirety of which is provided in a second region adjacent to the first region in a plan view of the semiconductor layer; and
- a metal layer that is connected to and in contact with the semiconductor substrate, on a bottom face side of the semiconductor layer, wherein the semiconductor substrate is a common drain region of the first vertical MOS transistor and the second vertical MOS transistor, in the plan view, the semiconductor layer is in a square shape, in the plan view, the first region and the second region are arranged in a first direction, in the plan view, a border line between the first region and the second region is a straight line that is orthogonal to the first direction, divides an area of the semiconductor layer in half, and passes through a center of the semiconductor layer, in the plan view, the first region includes only one first source pad and only one first gate pad, the one first source pad being connected to a first source electrode of the first vertical MOS transistor, the one first gate pad being connected to a first gate electrode of the first vertical MOS transistor, the first vertical MOS transistor includes:

- a first gate resistance element that is connected to the first gate electrode;
- a first gate electrode region that is, in the plan view, a region having a largest area among rectangular regions formable within the first region while encompassing the one first gate pad and excluding both the first source electrode and the first gate resistance element; and
- a first resistance element region that is, in the plan view, a region having a largest area among rectangular regions formable within the first region while encompassing the first gate resistance element and excluding both the first source electrode and the first gate electrode region, in the plan view, an entire length of an outer peripheral side among outer peripheral sides of the first gate electrode region and an entire length of an outer peripheral side among outer peripheral sides of the first resistance element region match a portion of an outer peripheral side among outer peripheral sides of the semiconductor layer, the outer peripheral side among the outer peripheral sides of the semiconductor layer being orthogonal to the border line and having a shortest distance to the one first gate pad, and in the plan view, the outer peripheral sides of the first resistance element region include only one corner portion among four corner portions of an outer periphery of the first gate electrode region, the one corner portion having a shortest distance to the border line and a shortest distance to one of outer peripheral sides among the outer peripheral sides of the semiconductor layer, the outer peripheral sides among the outer peripheral sides of the semiconductor layer being orthogonal to the border line.

2. The semiconductor device according to claim 1, wherein in the plan view, the second region includes only one second source pad and only one second gate pad, the one second source pad being connected to a second source electrode of the second vertical MOS transistor, the one second gate pad being connected to a second gate electrode of the second vertical MOS transistor, the second vertical MOS transistor includes:

- a second gate resistance element that is connected to the second gate electrode;
- a second gate electrode region that is, in the plan view, a region having a largest area among rectangular regions formable within the second region while encompassing the one second gate pad and excluding both the second source electrode and the second gate resistance element, and having a largest area; and a second resistance element region that is, in the plan view, a region having a largest area among rectangular regions formable within the second region while encompassing the second gate resistance element and excluding both the second source electrode and the second gate electrode region, in the plan view, an entire length of an outer peripheral side among outer peripheral sides of the second gate electrode region and an entire length of an outer peripheral side among outer peripheral sides of the second resistance element region match a portion of an outer peripheral side among outer peripheral sides of the semiconductor layer, the outer peripheral side among the outer peripheral sides of the semiconductor layer being orthogonal to the border line and having a shortest distance to the one second gate pad, in the plan view, the outer peripheral sides of the second resistance element region include only one corner portion among four corner portions of an outer periphery of the second gate electrode region, the one corner portion having a shortest distance to the border line and a shortest distance to one of outer peripheral sides among the outer peripheral sides of the semiconductor layer, the outer peripheral sides among the outer peripheral sides of the semiconductor layer being orthogonal to the border line, and in the plan view, (i) the one second source pad, the one second gate pad, the second gate electrode region, and the second resistance element region and (ii) the one first source pad, the one first gate pad, the first gate electrode region, and the first resistance element region are arranged line-symmetrically with respect to the border line as a symmetrical axis, respectively.

3. The semiconductor device according to claim 2, wherein in the plan view, an entire length of an outer peripheral side among the outer peripheral sides of the first resistance element region matches a portion of the border line.

4. The semiconductor device according to claim 2, wherein in the plan view, an entire length of an outer peripheral side among the outer peripheral sides of the first gate electrode region matches a portion of an outer peripheral side among the outer peripheral sides of the semiconductor layer, the outer peripheral side among the outer peripheral sides of the semiconductor layer being parallel to the border line.

5. The semiconductor device according to claim 3, wherein when: in the plan view, a combination of the first gate electrode region and the first resistance element region is defined as a first control region;

in the plan view, among two outer peripheral sides that are included in the outer peripheral sides of the semiconductor layer and parallel to the border line, an outer peripheral side having a shortest distance to the one first gate pad is defined as a first side, and an other outer peripheral side opposite to the first side is defined as a second side; and in the plan view, among two outer peripheral sides that are included in the outer peripheral sides of the semiconductor layer and orthogonal to the border line, an outer peripheral side having a shortest distance to the one first gate pad is defined as a third side, and an other outer peripheral side opposite to the third side is defined as a fourth side, in the plan view, a length of a portion in which an outer peripheral side of the first control region and the third side match is a half of a length of the third side, and in the plan view, among one or more lengths of one or more portions in each of which an outer peripheral side of the first control region and an outer peripheral side of the semiconductor layer match, the length of the portion in which the outer peripheral side of the first control region and the third side match is greatest.

6. The semiconductor device according to claim 4, wherein in the plan view, an outer peripheral side of the first source electrode is longest in a portion closest to the border line.

7. The semiconductor device according to claim 5, wherein in the plan view, a first gate trench and first gate wiring are provided in the first region, the first gate trench penetrating from a top face of the semiconductor layer to a depth that reaches a portion of the semiconductor layer, the first gate wiring being connected to the first gate electrode, in the plan view, the first gate trench extends in a direction orthogonal to the border line, and in the plan view, the first gate wiring is disposed to surround the first source electrode, except for a portion closest to the fourth side.

8. The semiconductor device according to claim 5, wherein in the plan view, a first gate trench and first gate wiring are provided in the first region, the first gate trench penetrating from a top face of the semiconductor layer to a depth that reaches a portion of the semiconductor layer, the first gate wiring being connected to the first gate electrode, in the plan view, the first gate trench extends in a direction parallel to the border line, and in the plan view, the first gate wiring is disposed to surround the first source electrode except for a portion closest to the first side.

9. The semiconductor device according to claim 5, wherein in the plan view, a first gate trench and a first Zener diode are provided in the first region, the first gate trench penetrating from a top face of the semiconductor layer to a depth that reaches a portion of the semiconductor layer, the first Zener diode being connected to the first gate electrode and the first source electrode, and in the plan view, a first connection region overlaps only an outer peripheral side among the outer peripheral sides of the first gate electrode region, the first connection region connecting the first Zener diode and the first source electrode, the outer peripheral side among the outer peripheral sides of the first gate electrode region being opposite to the first source electrode and parallel to a direction in which the first gate trench extends.

* * * * *